United States Patent
Kota et al.

(10) Patent No.: US 11,164,610 B1
(45) Date of Patent: Nov. 2, 2021

(54) MEMORY DEVICE WITH BUILT-IN FLEXIBLE DOUBLE REDUNDANCY

(71) Applicant: QUALCOMM Incorporated, San Diego, CA (US)

(72) Inventors: Anil Chowdary Kota, San Diego, CA (US); Hochul Lee, Los Angeles, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/894,606

(22) Filed: Jun. 5, 2020

(51) Int. Cl.
*G11C 7/02* (2006.01)
*G11C 7/06* (2006.01)
*G11C 7/12* (2006.01)
*G11C 7/10* (2006.01)
*G11C 7/14* (2006.01)
*G11C 7/18* (2006.01)

(52) U.S. Cl.
CPC .............. *G11C 7/065* (2013.01); *G11C 7/062* (2013.01); *G11C 7/106* (2013.01); *G11C 7/1087* (2013.01); *G11C 7/12* (2013.01); *G11C 7/14* (2013.01); *G11C 7/18* (2013.01)

(58) Field of Classification Search
CPC .................................................... G11C 7/065
USPC ........................................................ 365/207
See application file for complete search history.

(56) References Cited

U.S. PATENT DOCUMENTS

| 4,970,686 | A | | 11/1990 | Naruke et al. |
| 5,497,347 | A | * | 3/1996 | Feng ................... G06F 12/0895 365/189.02 |
| 5,811,863 | A | | 9/1998 | Rostoker et al. |
| 5,949,712 | A | | 9/1999 | Rao et al. |

(Continued)

FOREIGN PATENT DOCUMENTS

| CN | 1459113 A | 11/2003 |
| JP | H0386247 A | 4/1991 |

(Continued)

OTHER PUBLICATIONS

Robson N., et al., "Electrically Programmable Fuse (eFUSE): From Memory Redundancy to Autonomic Chips", Custom Integrated Circuits Conference, 2007, CICC '07, IEEE, IEEE, Piscataway, NJ, USA, Sep. 16, 2007 (Sep. 16, 2007), pp. 799-804, XP031223710, ISBN: 978-1-4244-0786-6.

(Continued)

*Primary Examiner* — Hoai V Ho
(74) *Attorney, Agent, or Firm* — Loza & Loza, LLP

(57) ABSTRACT

A memory device with built-in flexible redundancy is provided according to various aspects of the present disclosure. In certain aspects, a memory device includes a first sense amplifier, a second sense amplifier, a first comparator, a second comparator, a reference circuit, and a logic gate. During a redundant read operation, the first sense amplifier, the first comparator, and the reference circuit are used to read one copy of a redundant bit stored in the memory device, and the second sense amplifier, the second comparator, and the reference circuit are used to read another copy (Continued)

of the redundant bit stored in the memory device. The logic gate may then determine a bit value based on the bit values of the read copies of the redundant bit (e.g., determine a bit value of one if the bit value of at least one of the read copies of the redundant bit is one).

23 Claims, 13 Drawing Sheets

(56) References Cited

U.S. PATENT DOCUMENTS

| | | | |
|---|---|---|---|
| 6,266,269 | B1 | 7/2001 | Karp et al. |
| 6,272,041 | B1 | 8/2001 | Naji |
| 6,314,030 | B1 | 11/2001 | Keeth |
| 6,331,943 | B1 | 12/2001 | Naji et al. |
| 6,731,535 | B1 | 5/2004 | Ooishi et al. |
| 6,778,432 | B2 | 8/2004 | Ohtani |
| 6,885,578 | B2 | 4/2005 | Cha |
| 6,917,540 | B2 | 7/2005 | Ooishi |
| 7,102,910 | B2 | 9/2006 | Pham et al. |
| 7,206,220 | B2 | 4/2007 | Ditewig et al. |
| 7,245,546 | B2 | 7/2007 | Uvieghara |
| 7,254,078 | B1 | 8/2007 | Park et al. |
| 7,286,437 | B2 | 10/2007 | Kim et al. |
| 7,405,989 | B2 | 7/2008 | Chung |
| 7,492,629 | B2 | 2/2009 | Sugibayashi et al. |
| RE40,995 | E | 11/2009 | Ghodsi |
| 7,630,226 | B2 | 12/2009 | Matsufuji et al. |
| 7,656,738 | B2 | 2/2010 | Namekawa |
| 7,688,613 | B2 | 3/2010 | Chung et al. |
| 7,710,813 | B1 | 5/2010 | Im et al. |
| 7,724,600 | B1 | 5/2010 | Im et al. |
| 7,817,455 | B2 | 10/2010 | Fredeman et al. |
| 7,911,820 | B2 | 3/2011 | Anand et al. |
| 8,116,152 | B2 | 2/2012 | Kaku et al. |
| 8,134,854 | B2 | 3/2012 | Huang |
| 8,194,489 | B2 | 6/2012 | Bentley et al. |
| 8,331,126 | B2 | 12/2012 | Terzioglu |
| 8,611,144 | B2 | 12/2013 | Terzioglu |
| 8,724,418 | B2 | 5/2014 | Kim et al. |
| 8,760,955 | B2 | 6/2014 | Liao et al. |
| 8,803,590 | B2 | 8/2014 | Luo et al. |
| 9,418,763 | B2 | 8/2016 | Huang et al. |
| 2006/0050582 | A1 | 3/2006 | Perner |
| 2006/0104136 | A1 | 5/2006 | Gogl et al. |
| 2008/0002504 | A1 | 1/2008 | Nakano et al. |
| 2008/0094898 | A1 | 4/2008 | Nakano et al. |
| 2008/0252361 | A1 | 10/2008 | Chung et al. |
| 2008/0316852 | A1 | 12/2008 | Matsufuji et al. |
| 2009/0268503 | A1 | 10/2009 | Schepens et al. |
| 2010/0032778 | A1 | 2/2010 | Lu et al. |
| 2010/0054026 | A1 | 3/2010 | Xi et al. |
| 2010/0302833 | A1 | 12/2010 | Teramoto et al. |
| 2011/0317468 | A1 | 12/2011 | Terzioglu |
| 2013/0039117 | A1 | 2/2013 | Lin et al. |
| 2015/0310926 | A1 | 10/2015 | Akamatsu |

FOREIGN PATENT DOCUMENTS

| | | |
|---|---|---|
| JP | H06172550 A | 6/1994 |
| JP | H08316427 A | 11/1996 |
| JP | 3086247 B2 | 9/2000 |
| JP | 2006155710 A | 6/2006 |
| JP | 2008016085 A | 1/2008 |
| JP | 2008171477 A | 7/2008 |
| JP | 2008171481 A | 7/2008 |
| RU | 2310928 C2 | 11/2007 |
| TW | 200534280 | 10/2005 |
| TW | 200731511 | 8/2007 |
| TW | 200826283 A | 6/2008 |
| WO | 2009079662 A1 | 6/2009 |

OTHER PUBLICATIONS

Chang M., et al., "Challenges and Trends in Developing Nonvolatile Memory-Enabled Computing Chips for Intelligent Edge Devices", in IEEE Transactions on Electron Devices, vol. 67, No. 4, pp. 1444-1453, Apr. 2020, DOI: 10.1109/TED.2020.2976115. (Year: 2020).

International Search Report and Written Opinion—PCT/US2021/030235—ISA/EPO—dated Jul. 7, 2021.

* cited by examiner

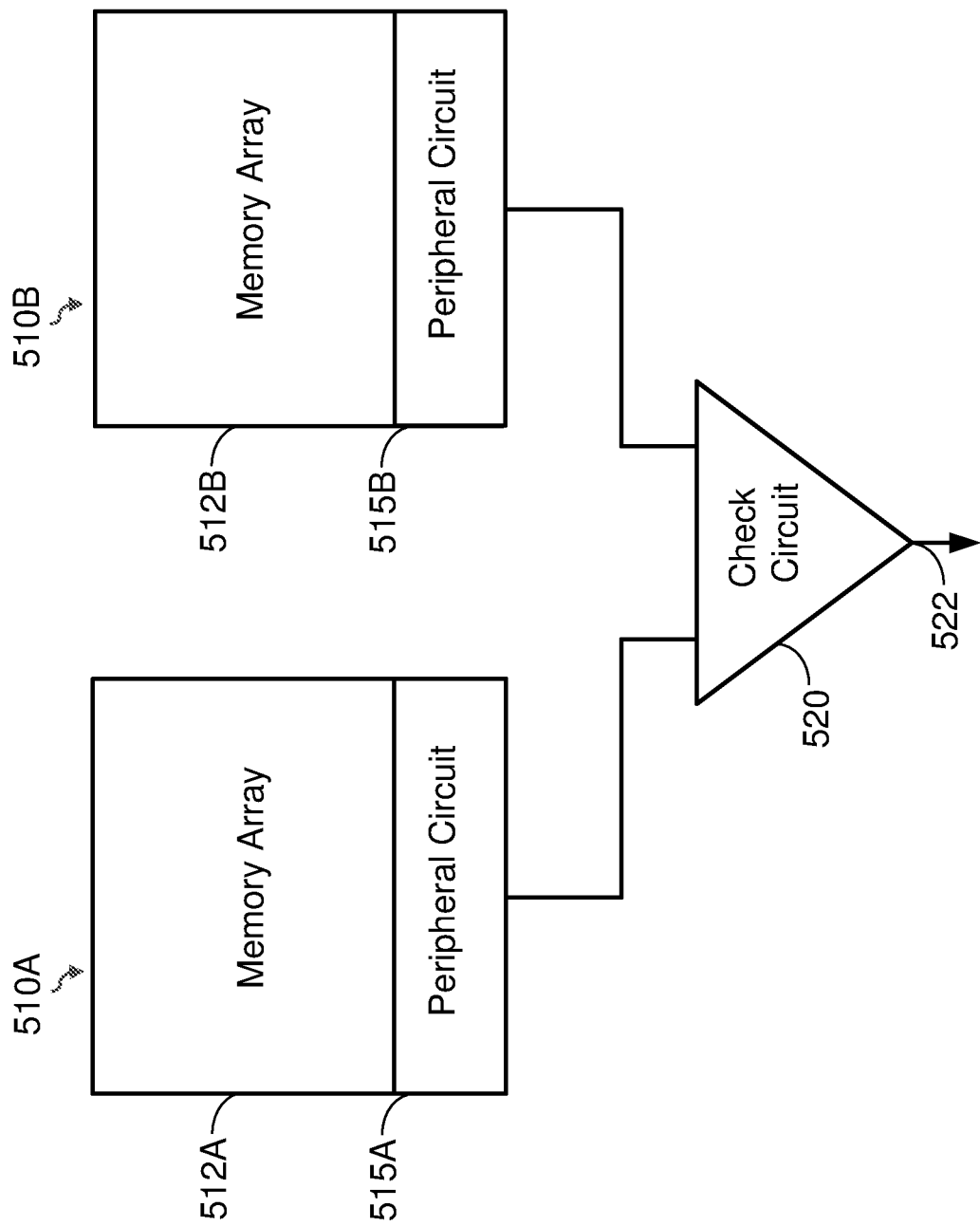

| Mode | en_double | addr[0] | muxa | muxb |
|---|---|---|---|---|
| Redundant Mode | 1 | X | 1 | 1 |
| Non-Redundant Mode | 0 | 0 | 1 | 0 |
| | | 1 | 0 | 1 |

MEMORY DEVICE WITH BUILT-IN FLEXIBLE DOUBLE REDUNDANCY

BACKGROUND

Field

Aspects of the present disclosure relate generally to memory, and more particularly, to a memory device with built-in flexible redundancy.

Background

Non-volatile memory can store data without power. A non-volatile memory device may include an array of bit cells where each bit cell stores a respective bit. Each bit cell in the array may include a respective fuse (e.g., electrical fuse (eFuse)), in which the value of the bit stored in the bit cell depends on whether the respective fuse is blown or unblown.

SUMMARY

The following presents a simplified summary of one or more implementations in order to provide a basic understanding of such implementations. This summary is not an extensive overview of all contemplated implementations and is intended to neither identify key or critical elements of all implementations nor delineate the scope of any or all implementations. Its sole purpose is to present some concepts of one or more implementations in a simplified form as a prelude to the more detailed description that is presented later.

A first aspect relates to a memory device. The memory device includes a first sense amplifier having an input and an output, a first switch coupled between the input of the first sense amplifier and a first bit line, a second sense amplifier having an input and an output, a second switch coupled between the input of the second sense amplifier and a second bit line, and a reference circuit having an output. The memory device also includes a first comparator having a first input, a second input, and an output, wherein the first input of the first comparator is coupled to the output of the first sense amplifier, and the second input of the first comparator is coupled to the output of the reference circuit. The memory device also includes a second comparator having a first input, a second input, and an output, wherein the first input of the second comparator is coupled to the output of the second sense amplifier, and the second input of the second comparator is coupled to the output of the reference circuit. The memory device further includes a logic gate having a first input, a second input, and an output, wherein the first input of the logic gate is coupled to the output of the first comparator, and the second input of the logic gate is coupled to the output of the second comparator.

A second aspect relates to a memory device. The memory device includes a reference circuit having a bias output. The memory device also includes a first transistor, wherein a source of the first transistor is coupled to a supply rail, and a gate of the first transistor is coupled to the bias output of the reference circuit, a second transistor, wherein a drain of the second transistor is coupled to the drain of the first transistor, and a gate of the second transistor is biased by a bias voltage, and a first switch coupled between a source of the second transistor and a first bit line. The memory device also includes a third transistor, wherein a source of the third transistor is coupled to the supply rail, and a gate of the third transistor is coupled to the bias output of the reference circuit, a fourth transistor, wherein a drain of the fourth transistor is coupled to the drain of the third transistor, and a gate of the fourth transistor is biased by the bias voltage, and a second switch coupled between a source of the fourth transistor and a second bit line.

A third aspect relates to a system. The system includes a first memory device and a processor coupled to the first memory device. The first memory device includes a first sense amplifier having an input and an output, a first switch coupled between the input of the first sense amplifier and a first bit line, a second sense amplifier having an input and an output, a second switch coupled between the input of the second sense amplifier and a second bit line, and a reference circuit having an output. The first memory device also includes a first comparator having a first input, a second input, and an output, wherein the first input of the first comparator is coupled to the output of the first sense amplifier, and the second input of the first comparator is coupled to the output of the reference circuit. The first memory device also includes a second comparator having a first input, a second input, and an output, wherein the first input of the second comparator is coupled to the output of the second sense amplifier, and the second input of the second comparator is coupled to the output of the reference circuit. The first memory device further includes a logic gate having a first input, a second input, and an output, wherein the first input of the logic gate is coupled to the output of the first comparator, and the second input of the logic gate is coupled to the output of the second comparator.

A fourth aspect relates to a method of a redundant read operation in a memory device. The memory device includes a first sense amplifier, a first switch coupled between an input of the first sense amplifier and a first bit line, a second sense amplifier, and a second switch coupled between an input of the second sense amplifier and a second bit line. The method includes turning on the first switch and the second switch, comparing a first voltage at an output of the first sense amplifier with a reference voltage, and determining a first bit value based on the comparison of the first voltage with the reference voltage. The method also includes comparing a second voltage at an output of the second sense amplifier with the reference voltage, and determining a second bit value based on the comparison of the second voltage with the reference voltage. The method further includes determining a third bit value based on the first bit value and the second bit value.

BRIEF DESCRIPTION OF THE DRAWINGS

FIG. 5 shows an example in which two copies of data are stored in two separate memory devices for double redundancy according to certain aspects of the present disclosure.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A memory device may be used to store data such as firmware, security keys, system settings, etc. The memory device includes an array of bit cells arranged in rows and columns (referred to as a memory array), where each bit cell stores a single bit.

Figure 1:
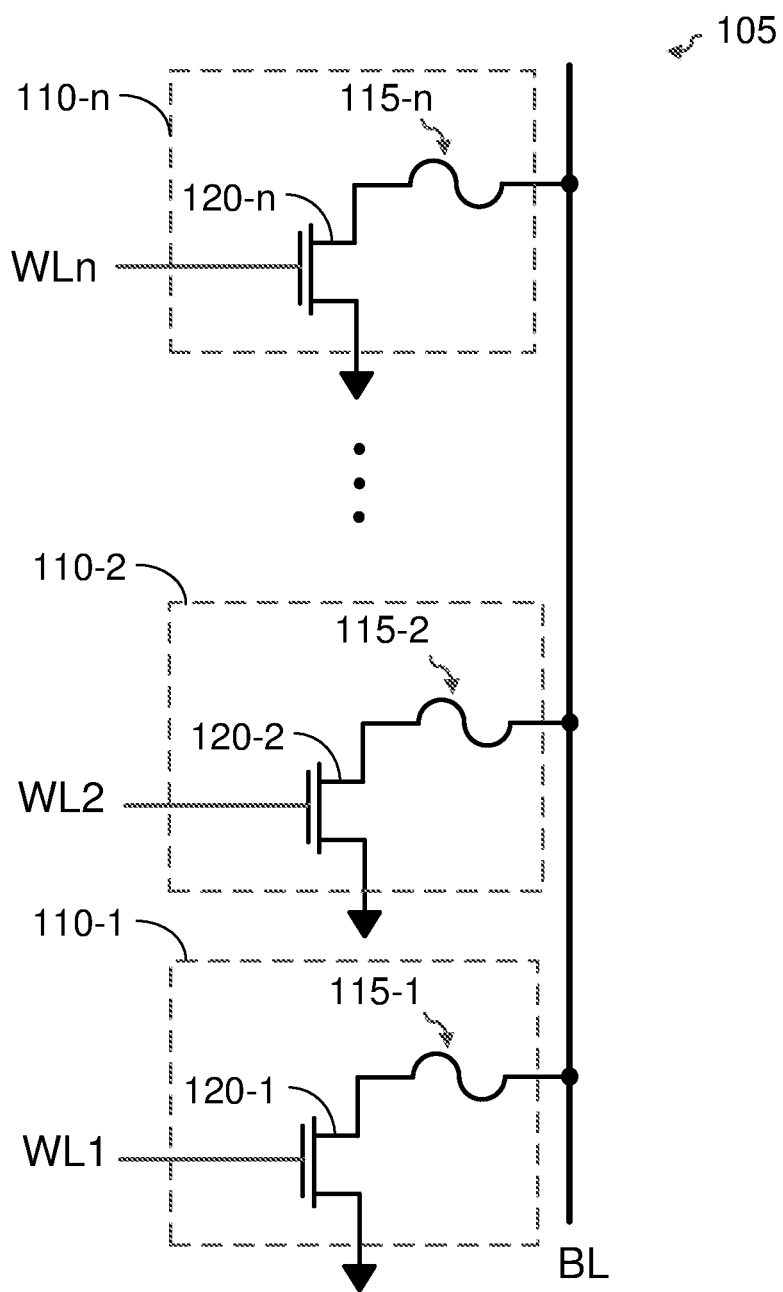
FIG. 1 shows an example of bit cells where each bit cell includes a respective fuse according to certain aspects of the present disclosure.

FIG. 1 shows an example of a column 105 of bit cells 110-1 to 110-n in a memory array coupled to a bit line (labeled "BL"). Each of the bit cells 110-1 to 110-n is also coupled to a respective word line (labeled "WL1" to "WLn"). The word lines WL1 to WLn may be used to select one of the bit cells 110-1 to 110-n in the column at a time.

In this example, each of the bit cells 110-1 to 110-n includes a respective transistor 120-1 to 120-n (e.g., n-type field effect transistor (NFET)) and a respective fuse 115-1 to 115-n (e.g., eFuse). In each bit cell 110-1 to 110-n, the respective fuse 115-1 to 115-n is coupled between the bit line BL and the drain of the respective transistor 120-1 to 120-n, the gate of the respective transistor 120-1 to 120-n is coupled to the respective word line WL1 to WLn, and the source of the respective transistor 120-1 to 120-n is coupled to ground.

The bit value stored in each bit cell 110-1 to 110-n depends on whether the respective fuse 115-1 to 115-n is blown or unblown. For example, a bit cell may store a bit value of zero if the respective fuse 115-1 to 115-n is unblown and store a bit value of one if the respective fuse 115-1 to 115-n is blown. The resistance of an unblown fuse may be low (e.g., 50Ω) and the resistance of a blown fuse may be high (e.g., 10 KΩ). Thus, the bit value stored in a bit cell may be read by sensing the resistance of the respective fuse, as discussed further below.

To blow the fuse of one of the bit cells 110-1 to 110-n (i.e., program the bit cell with a bit value of one), a select circuit selects the word line corresponding to the bit cell, and a write circuit sends a high current through the fuse of the bit cell via the bit line BL to blow the fuse. The high current electro-migrates metal in the fuse, causing the resistance of the fuse to significantly increase.

To read the bit stored in one of the bit cells 110-1 to 110-n, the select circuit selects the word line corresponding to the bit cell, and a read circuit senses the resistance of the respective fuse via the bit line BL. For example, the read circuit may sense the resistance of the respective fuse by sending a sense current through the respective fuse via the bit line BL, and sensing the resulting voltage on the bit line BL, which is a function of the resistance of the respective fuse. The read circuit may read a one if the resistance is high, which corresponds to a blown fuse, and the read circuit may read a zero if the resistance is low, which corresponds to an unblown fuse.

Figure 2:
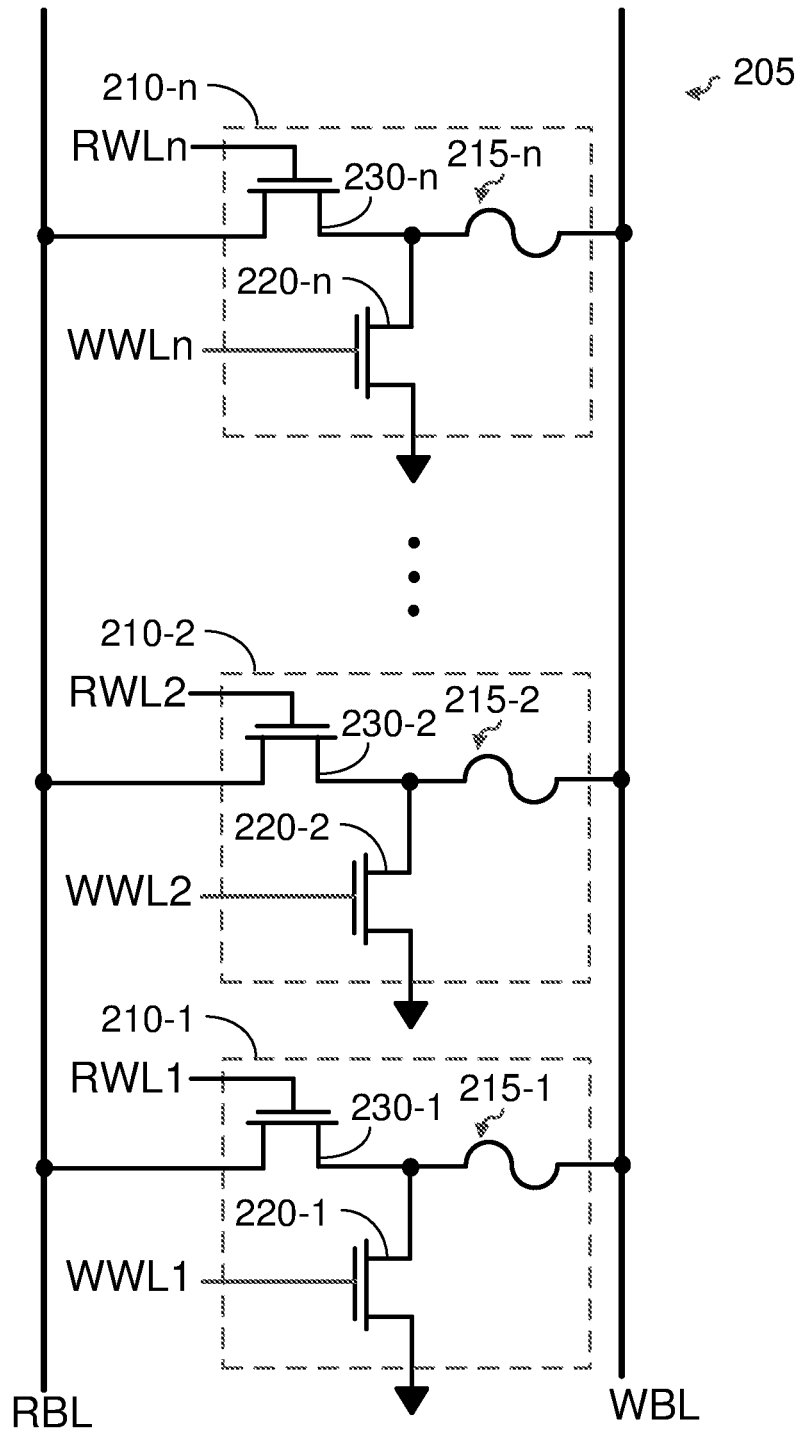
FIG. 2 shows another example of bit cells where each bit cell includes a respective fuse according to certain aspects of the present disclosure.

FIG. 2 shows another example of a column 205 of bit cells 210-1 to 210-n in a memory array according to certain aspects. In this example, the bit line BL shown in FIG. 1 is split into a write bit line (labeled "WBL") and a read bit line (labeled "RBL"). Also, each of the word lines shown in FIG. 1 is split into a respective write word line (labeled "WWL1" to "WWLn") and a respective read word line (labeled "RWL1" to RWLn"). The write word lines WWL1 to WWLn may be used to select one of the bit cells 210-1 to 210-n at a time for writing, and the read word lines RWL1 to RWLn may be used to select one of the bit cells 210-1 to 210-n at a time for reading.

In this example, each of the bit cells 210-1 to 210-n includes a respective write-access transistor 220-1 to 220-n, a respective read-access transistor 230-1 to 230-n, and a respective fuse 215-1 to 215-n (e.g., eFuse). In each bit cell 210-1 to 210-n, the respective fuse 215-1 to 215-n is coupled between the write bit line WBL and the drain of the respective write-access transistor 220-1 to 220-n, the gate of the respective write-access transistor 220-1 to 220-n is coupled to the respective write word line WWL1 to WWLn, and the source of the respective write-access transistor 220-1 to 220-n is coupled to ground. Also, in each bit cell 210-1 to 210-n, the drain of the respective read-access transistor 230-1 to 230-n is coupled to the read bit line RBL, the gate of the respective read-access transistor 230-1 to 230-n is coupled to the respective read word line RWL1 to RWLn, and the source of the respective read-access transistor 230-1 to 230-n is coupled to the respective fuse 215-1 to 215-n.

The bit value stored in each bit cell 210-1 to 210-n depends on whether the respective fuse 215-1 to 215-n is blown or unblown. For example, a bit cell may store a bit value of zero if the respective fuse 215-1 to 215-n is unblown and store a bit value of one if the respective fuse 215-1 to 215-n is blown. As discussed above, the resistance of an unblown fuse may be low (e.g., 50Ω) and the resistance of a blown fuse may be high (e.g., 10 KΩ).

To blow the fuse of one of the bit cells 210-1 to 210-n (i.e., program the bit cell with a bit value of one), a select circuit turns on the respective write-access transistor via the respective write word line and turns off the respective read-access transistor. A write circuit then sends a high current through the fuse of the bit cell via the write bit line WBL to blow the fuse. The high current electro-migrates metal in the fuse, causing the resistance of the fuse to significantly increase.

Figure 3A:
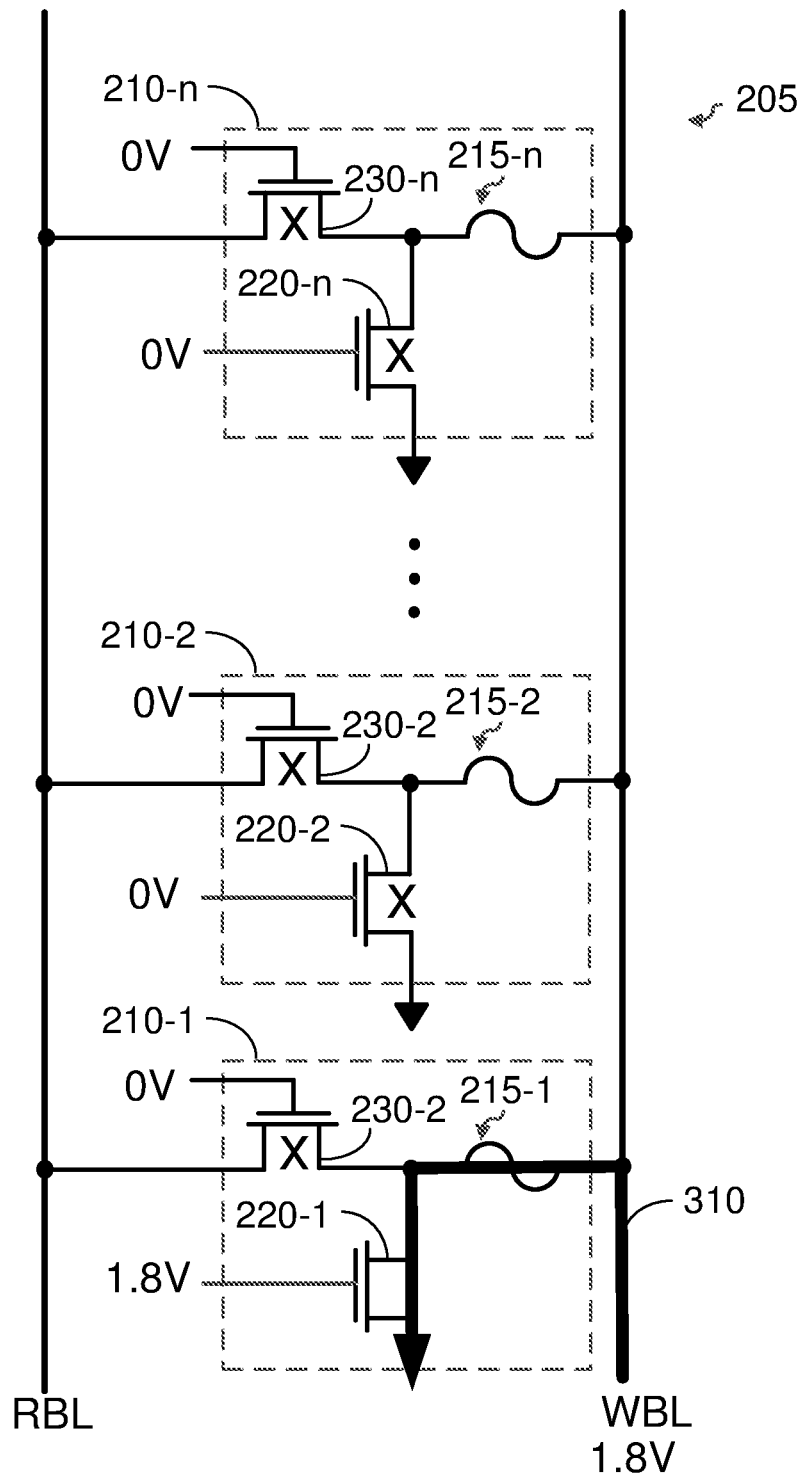
FIG. 3A shows an exemplary path of a write current for blowing a fuse in a bit cell according to certain aspects of the present disclosure.

FIG. 3A shows an example of the current path 310 for blowing the fuse 215-1 in the bit cell 210-1. FIG. 3A also shows an example of the voltages applied to the gates of the transistors in each of the bit cells 210-1 to 210-n, where an "X" indicates a transistor that is turned off. In the example in FIG. 3A, the select circuit turns on the write-access transistor 220-1 in the bit cell 210-1 to enable the current path 310 for blowing the fuse 215-1 in the bit cell 210-1. As shown in FIG. 3A, the select circuit applies a high voltage (e.g., 1.8V) on the gate of the write-access transistor 220-1 via the respective write word line to turn on the write-access transistor 220-1, and applies zero volts on the gate of the read-access transistor 230-1, which is turned off during writing.

To read the bit stored in one of the bit cells 210-1 to 210-n, the select circuit turns on the respective read-access transistor via the respective read word line and turns off the respective write-access transistor. The write bit line WBL may be grounded during the read operation. A read circuit then senses the resistance of the respective fuse via the read bit line RBL. For example, the read circuit may sense the resistance by sending a sense current through the respective fuse via the read bit line RBL, and sensing the resulting voltage on the read bit line RBL, which is a function of the resistance of the respective fuse. The read circuit may read a one if the resistance is high, which corresponds to a blown fuse, and the read circuit may read a zero if the resistance is low, which corresponds to an unblown fuse.

Figure 3B:
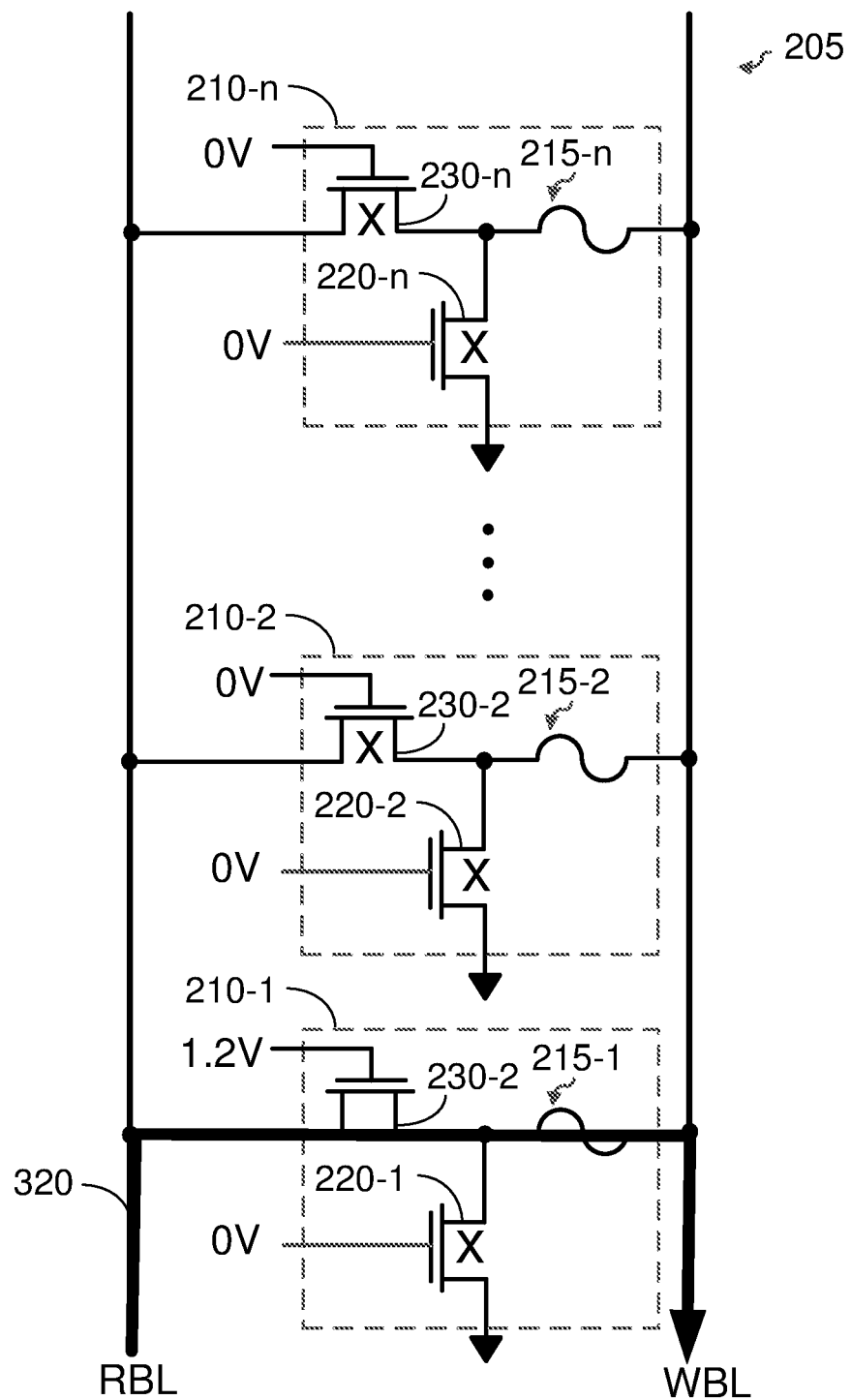
FIG. 3B shows an exemplary path of a sense current for reading a bit cell according to certain aspects of the present disclosure.

FIG. 3B shows an example of the current path 320 for reading the bit cell 210-1. FIG. 3B also shows an example of the voltages applied to the gates of the transistors in each of the bit cells 210-1 to 210-n, where an "X" indicates a transistor that is turned off. In the example in FIG. 3B, the select circuit turns on the read-access transistor 230-1 in the bit cell 210-1 to enable the current path 320 for reading the bit cell 210-1. As shown in FIG. 3B, the select circuit applies a high voltage (e.g., 1.2V) on the gate of the read-access transistor 230-1 via the respective read word line to turn on the read-access transistor 230-1, and applies zero volts on the gate of the write-access transistor 220-1, which is turned off during reading.

The bit cells 210-1 to 210-n in FIG. 2 reduce leakage current compared with the bit cells 110-1 to 110-n in FIG. 1. This is because the transistors 120-1 to 120-n in FIG. 1 need to be large in order to handle large write currents used to blow the fuses 115-1 to 115-n. Because of their large sizes, the transistors 120-1 to 120-n in the bit cells 110-1 to 110-n may leak a large amount of current even when they are turned off. The large leakage current increases power consumption and may affect read operations. In the bit cells 210-1 to 210-n in FIG. 2, the read-access transistors 230-1 to 230-n may be made much smaller than the write-access transistors 220-1 to 220-n to reduce leakage current on the read bit line RBL. This is because the read-access transistors 230-1 to 230-n are turned off during write operations, and therefore do not need to handle large write currents to blow the fuses 215-1 to 215-n. Rather, the read-access transistors 230-1 to 230-n handle much smaller currents during read operations, which allow the read-access transistors 230-1 to 230-n to be smaller for reduced leakage current.

A challenge with using a fuse to store a bit is that the resistance of a blown fuse may decrease over time due to a reverse EM effect caused by temperature gradient and frequent read operations. The decrease in resistance over time causes some of the bit cells with blown fuses to be erroneously read as zeros instead of ones. The erroneous reads may be unacceptable in cases where sensitive data is stored in the memory array such as firmware, security keys and system settings.

Figure 4B:
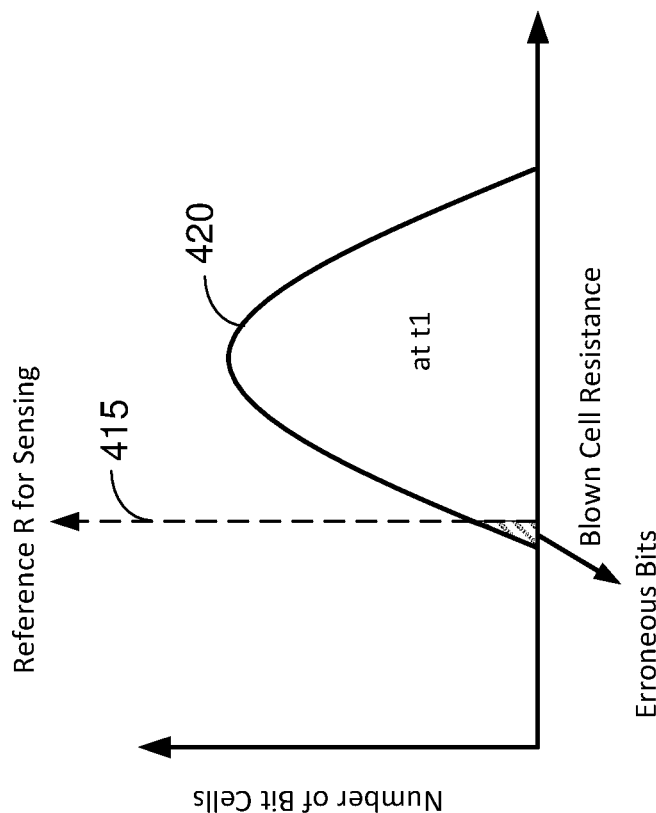
FIG. 4B shows an example of the resistance distribution for the bit cells with blown fuses after numerous read operations according to certain aspects of the present disclosure.
Figure 4A:
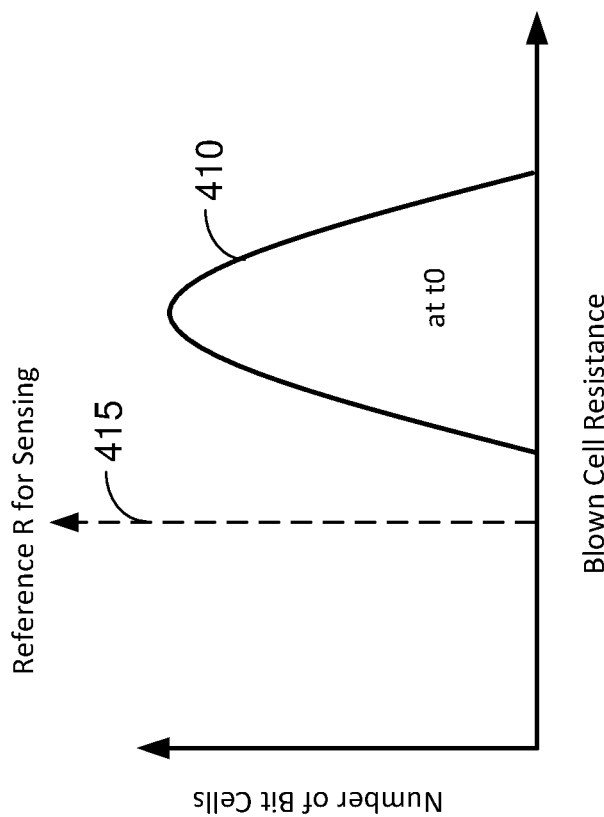
FIG. 4A shows an example of a resistance distribution for bit cells with blown fuses according to certain aspects of the present disclosure.

An example of the reverse EM effect is illustrated in FIGS. 4A and 4B. FIG. 4A shows an exemplary distribution of resistances 410 for bit cells with blown fuses at time t0, which is immediately after the fuses have been blown. FIG. 4A also shows a reference resistance 415 used in a read operation to determine whether a bit cell stores a one or zero. In this example, a sensed resistance greater than the reference resistance 415 is read as a bit value of one and a sensed resistance less than the reference resistance 415 is read as a bit value of zero. As shown in FIG. 4A, the resistance of each bit cell with a blown fuse is greater than the reference resistance 415. Thus, each bit cell with a blown fuse is correctly read as a one at time t0.

FIG. 4B shows an example of the distribution of resistances 420 for the bit cells with blown fuses at time t1, which occurs after the bit cells have been read numerous times. As shown in FIG. 4B, the resistances of some of the bit cells have decreased below the reference resistance 415 due to the reverse EM effect. As a result, these bit cells are erroneously read as zeros instead of ones.

One approach for addressing the above problem is to write two copies of data to two separate memory devices 510A and 510B, an example of which is shown in FIG. 5. Each memory device 510A and 510B includes a respective memory array 512A and 512B configured to store the data and a respective peripheral circuit 515A and 515B configured to write the data to and read the data from the respective memory array 512A and 512B. In this approach, one of the memory device 510A and 510B serves as a redundant memory that stores a redundant copy of the data to improve read accuracy.

During a read operation, both copies of the data are read from the memory devices 510A and 510B. For each bit of the data, the check circuit 520 checks the bit read from the memory device 510A and the bit read from the memory device 510B. If the bit read from at least one of the memory devices 510A and 510B is a one, then the check circuit 520 determines that the bit value is one regardless of whether the bit read from the other one of the memory device 510A and 510B is a one or a zero (i.e., the check circuit 520 performs a logical OR operation). Thus, if the bit read from one of the memory devices 510A and 510A is erroneously read as a zero instead of a one due to the reverse EM effect, the check circuit 520 is still able to determine the correct bit value of one as long as the bit from the other one of the memory devices 510A and 510B is correctly read. The probability that the bit read from the memory device 510A and the bit read from the memory device 510B are both erroneously read due to the reverse EM effect is much lower than the probability that the bit read from one of the memory devices 510A and 510B is erroneously read due to the reverse EM effect. Thus, this approach improves the accuracy of read operations by using a redundant memory device that stores a redundant copy of the data.

A drawback of the above approach is that the redundant memory device increases area overhead and power consumption. Accordingly, an approach for achieving data redundancy that uses less area overhead and lower power is desirable.

Aspects of the present disclosure provide a memory device with built-in flexible data redundancy that lowers area overhead and power consumption compared with the above approach, as discussed further below.

Figure 6A:
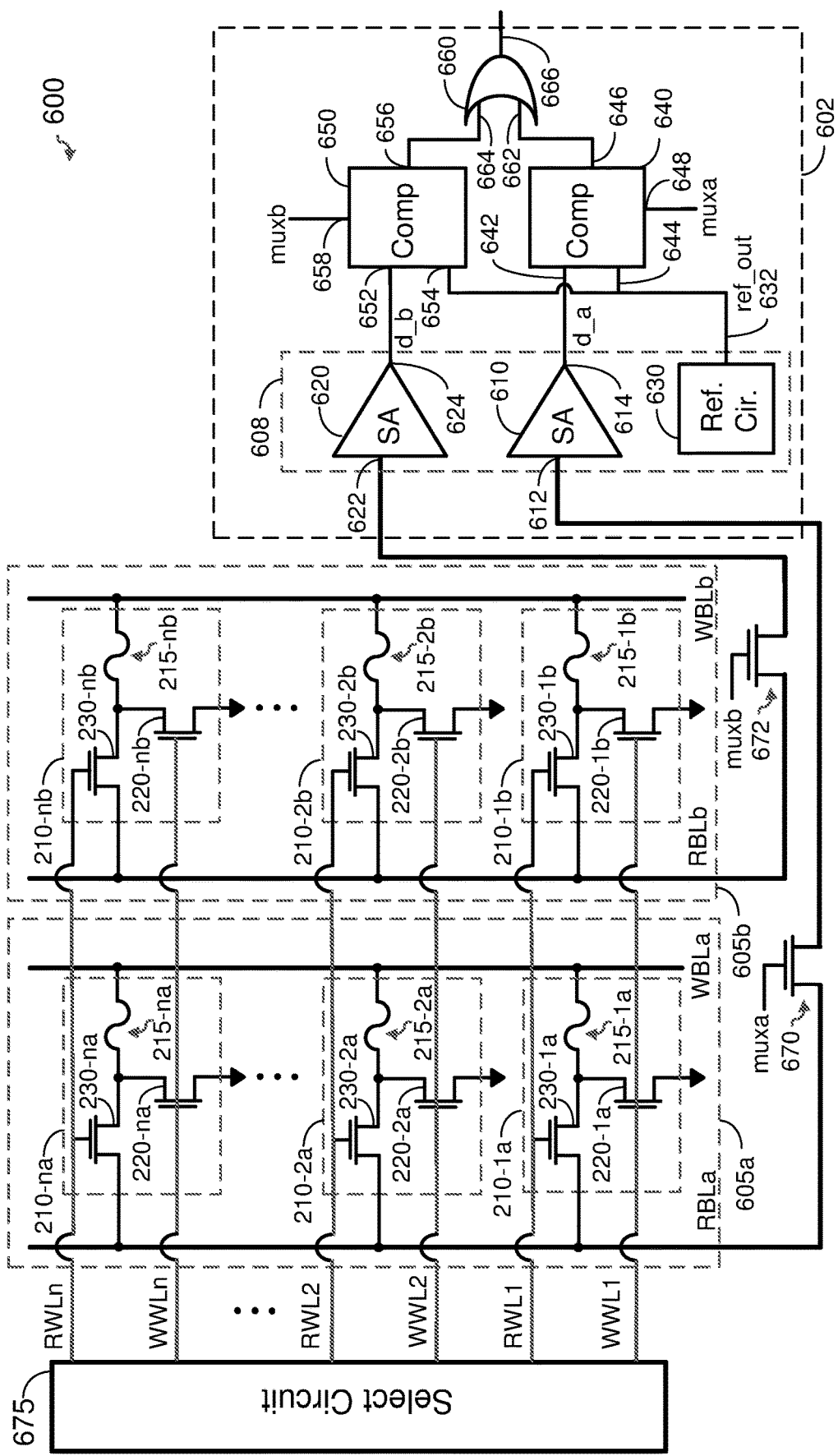
FIGS. 6A and 6B show an exemplary memory device with built-in flexible redundancy according to certain aspects of the present disclosure.

FIG. 6A shows an exemplary memory device 600 with built-in flexible data redundancy according to certain aspects of the present disclosure. The memory device 600 includes a memory array configured to store redundant data, non-redundant data, or a combination of both. The memory array includes multiple columns of bit cells (e.g., 32 or more columns). For ease of illustration, FIG. 6A shows a pair of adjacent columns in the memory array including a first column 605a and a second column 605b. In the example in FIG. 6A, each of the first column 605a and the second column 605b is implemented with the exemplary column 205 shown in FIG. 2 (i.e., each of the first column 605a and the second column 605b is a separate instance of the column 205 in FIG. 2). However, it is to be appreciated that, in other implementations, each of the first column 605a and the second column 605b may be implemented with the exemplary column 105 shown in FIG. 1.

In FIG. 6A, the bit cells 210-1a to 210-na in the first column 605a are designated with the letter "a" and the bit cells 210-1b to 210-nb in the second column 605b are designated with the letter "b" in order to distinguish between the bit cells in the first column 605a and the second column 605b.

The first column 605a and the second column 605b may store redundant data, non-redundant data, or a combination of both. As used herein, redundant data refers to data in which two copies of the data are stored in the memory array of the memory device 600 for double redundancy. Each bit in the redundant data is referred to as a redundant bit. In certain aspects, two copies of a redundant bit are stored in two bit cells located in adjacent columns and the same row. For example, two copies of a redundant bit may be stored in the bit cell 210-1a in the first column 605a and the bit cell 210-1b in the second column 605b. The redundant bit may be written to each of the bit cells 210-1a and 210-1b by performing the exemplary write operation illustrated in FIG. 3A for each of the bit cells 210-1a and 210-1b.

As used herein, non-redundant data refers to data in which one copy of the data is stored in the memory array of the memory device 600. Each bit in the non-redundant data is referred to as a non-redundant bit. In certain aspects, non-redundant bit is stored in a respective bit cell in the memory array. For example, a first non-redundant bit may be stored in the bit cell 210-1a in the first column 605a and a second non-redundant may be stored in the bit cell 210-1b in the second column 605b. The first non-redundant bit may be written to the bit cell 210-1a and the second non-redundant bit may be written to the bit cell 210-1b by performing the exemplary write operation illustrated in FIG. 3A for each of the bit cells 210-1a and 210-1b. The first and second non-redundant bits may have the same bit value or different bit values. Thus, the bit cells 210-1a and 210-1b may be used to store one redundant bit or two non-redundant bits.

In one example, the first and second columns 605a and 605b may store a combination of redundant bits and non-redundant bits. In this example, bit cells in a first set of rows store redundant bits and bit cells in a second set of rows store non-redundant bits. Each row includes a pair of bit cells in which one of the bit cells in the pair is located in the first column 605a and the other one of the bit cells in the pair is located in the second column 605b. For instance, the first row in FIG. 6A includes the bit cell 210-1a in the first column 605a and the bit cell 210-1b in the second column 605b, the second row in FIG. 6A includes the bit cell 210-2a in the first column 605a and the bit cell 210-2b in the second column 605b, and so forth.

In this example, each pair of bit cells in the first set of rows stores one redundant bit, in which a copy of the redundant bit is stored in each of the bit cells in the pair. Each pair of bit cells in the second set of rows stores two non-redundant bits, in which one of the bit cells in the pair stores one of the two non-redundant bits and the other one of the bit cells in the pair stores the other one of the two non-redundant bits. The number of rows in the first set of rows and the number of rows in the second set of rows are variable and may depend on the size of the redundant data and the size of the non-redundant data stored in the memory device 600. Thus, the number of rows allocated for redundant data and the number of rows allocated for non-redundant data are variable, providing the memory device 600 with the flexibility to store redundant data of different sizes and non-redundant data of different sizes.

Figure 6B:
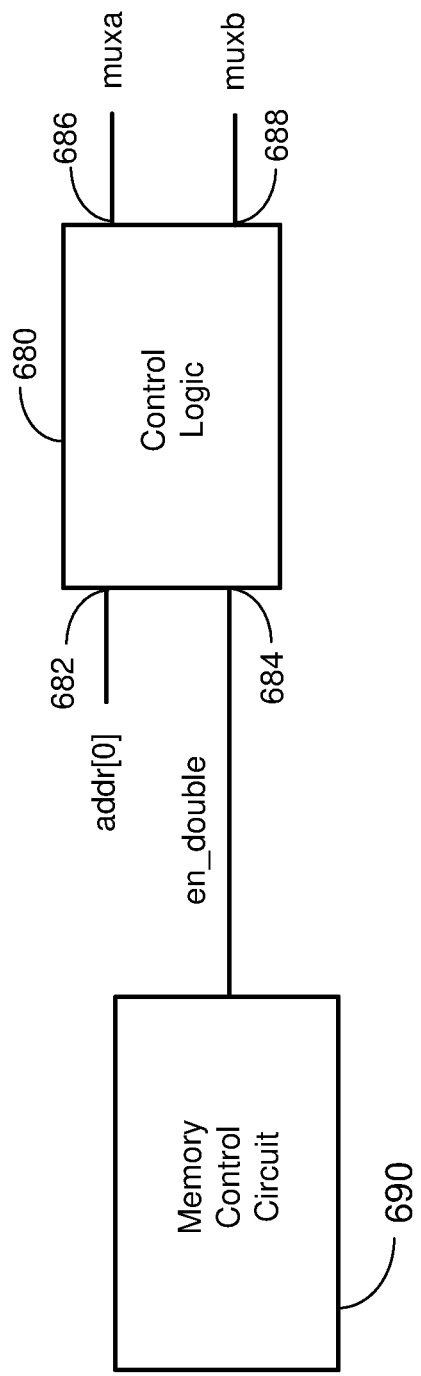

The memory device 600 also includes a select circuit 675, a read circuit 602, a first switch 670, a second switch 672, a control logic 680, and a memory control circuit 690. The control logic 680 and the memory control circuit 690 are shown in FIG. 6B. The select circuit 675 is coupled to the write word lines WWL1 to WWLn and the read word lines RWL1 and RWLn. As discussed further below, the select circuit 675 is configured to select one of the rows at a time for a read operation by applying a high voltage (e.g., 1.2V) on the respective read word line with the other read word lines at approximately zero volts.

The read circuit 602 supports read operations in a redundant mode and a non-redundant mode. In the redundant mode, the read circuit 602 reads redundant bits from the first column 605a and the second column 605b. In the non-redundant mode, the read circuit 602 reads non-redundant bits from the first column 605a and the second column 605b. The redundant mode and the non-redundant mode are controlled by the memory control circuit 690, as discussed further below.

Figure 7:
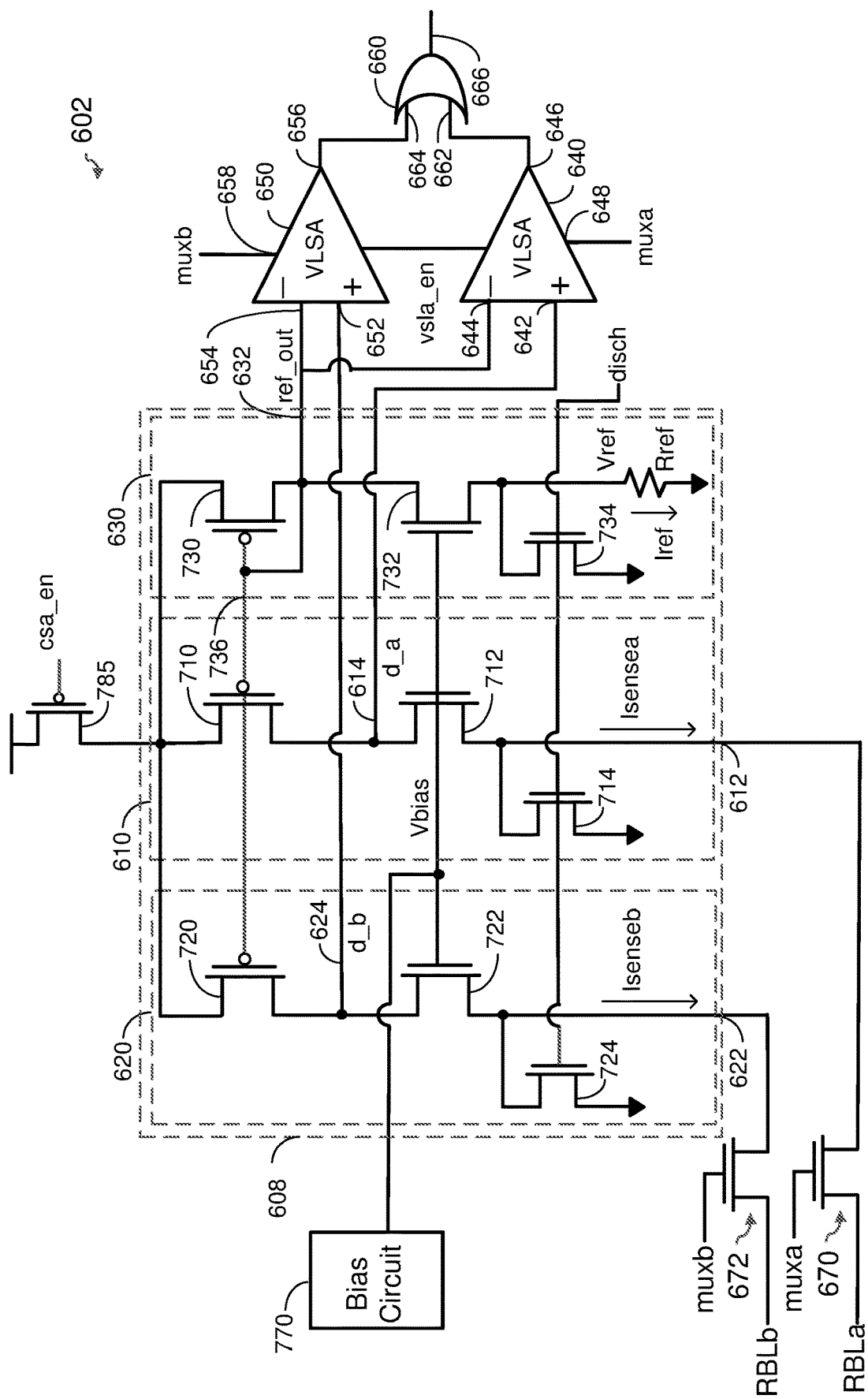
FIG. 7 shows an exemplary implementation of a sense circuit according to certain aspects of the present disclosure.

The read circuit 602 includes a sense circuit 608, a first comparator 640, a second comparator 650, and a logic gate 660. Each of the first comparator 640 and the second comparator 650 may be implemented with a voltage-latched sense amplifier (VLSA), an example of which is shown in FIG. 7. In the example in FIG. 6A, the logic gate 660 is implemented with an OR gate. However, it is to be appreciated that the logic gate 660 may be implemented with another type of logic gate.

The sense circuit 608 includes a first sense amplifier 610, a second sense amplifier 620, and a reference circuit 630. The first sense amplifier 610 includes an input 612 and an output 614. The first switch 670 is coupled between the input 612 of the first sense amplifier 610 and the read bit line RBLa of the first column 605a, and is used to selectively couple the input 612 of the first sense amplifier 610 to the read bit line RBLa. In the example in FIG. 6A, the first switch 670 is implemented with an n-type field effect transistor (NFET).

The second sense amplifier 620 includes an input 622 and an output 624. The second switch 672 is coupled between the input 622 of the second sense amplifier 620 and the read bit line RBLb of the second column 605b, and is used to selectively couple the input 622 of the second sense amplifier 620 to the read bit line RBLb. In the example in FIG. 6A, the second switch 672 is implemented with an NFET.

The reference circuit 630 is configured to generate a reference voltage (labeled "ref_out") and output the reference voltage at an output 632 of the reference circuit 630. As discussed further below, the reference voltage corresponds to a reference resistance and is used by each comparator 640 and 650 to decide whether a read bit is a one or a zero.

The first comparator 640 includes a first input 642, a second input 644, a control input 648, and an output 646. The first input 642 is coupled to the output 614 of the first sense amplifier 610, and the second input 644 is coupled to the output 632 of the reference circuit 630.

The second comparator 650 includes a first input 652, a second input 654, a control input 658, and an output 656. The first input 652 is coupled to the output 624 of the second sense amplifier 620, and the second input 654 is coupled to the output 632 of the reference circuit 630.

The logic gate 660 includes a first input 662, a second input 664, and an output 666. The first input 662 is coupled to the output 646 of the first comparator 640, the second input 664 is coupled to the output 656 of the second comparator 650, and the output 666 provides the output for the read circuit 602. The output 666 may be coupled to an output buffer (not shown).

As discussed above, the memory control circuit 690 controls whether the read circuit 602 operates in the redundant mode or the non-redundant mode. In this regard, the memory control circuit 690 outputs a redundancy enable signal (labeled "en_double") to enable the redundant mode or the non-redundant mode. In one example, the redundancy enable signal has a value of one to enable the redundant mode and a value of zero to enable the non-redundant mode (i.e., disable the redundant mode). In this example, the memory control circuit 690 may enable the redundant mode or the non-redundant mode depending on the row that is currently selected for a read operation. In this example, the memory control circuit 690 asserts the redundancy enable signal high (i.e., one) to enable the redundant mode if the currently selected row is in the first set of rows. As discussed above, the rows in the first set of rows store redundant bits. The memory control circuit 690 asserts the redundancy enable signal low (i.e., zero) to enable the non-redundant mode (i.e., disable the redundant mode) if the currently selected row is in the second set of rows. As discussed above, the rows in the second set of rows store non-redundant bits.

The control logic 680 receives the redundancy enable signal at input 684, and operates the read circuit 602 in the redundant mode or the non-redundant mode based on the redundancy enable signal. More particularly, the control logic 680 operates the read circuit 602 in the redundant mode if the redundancy enable signal is one and operates the read circuit 602 in the non-redundant mode if the redundancy enable signal is zero.

The control logic 680 controls whether the read circuit 602 operates in the redundant mode or the non-redundant mode by outputting a first control signal (labeled "muxa") at output 686 and a second control signal (labeled "muxb") at output 688. The first control signal muxa is input to the first switch 670 and the control input 648 of the first comparator 640, and the second control signal muxb is input to the second switch 672 and the control input 658 of the second comparator 650. To operate the read circuit 602 in the redundant mode, the control logic 680 asserts both control signals muxa and muxb high (i.e., one). Thus, in this example, the control logic 680 asserts both control signals muxa and muxb high when the redundancy enable signal is high. To operate the read circuit 602 in the non-redundant mode, the control logic 680 asserts one of the control signals muxa and muxb high (i.e., one) and the other one of the control signals muxa and muxb low (i.e., zero), as discussed further below.

Exemplary operations of the read circuit 602 in the redundant mode will now be described according to certain aspects. In this case, both control signals muxa and muxb are asserted high to operate the read circuit 602 in the redundant mode. Asserting the first control signal muxa high causes the first switch 670 (which is implemented with an NFET in FIG. 6A) to turn on. Asserting the second control signal muxb high causes the second switch 672 (which is implemented with an NFET in FIG. 6A) to turn on. Thus, in the redundant mode, the input of 612 of the first sense amplifier 610 is coupled to the read bit line RBLa of the first column 605$a$ via the first switch 670, and the input of 622 of the second sense amplifier 620 is coupled to the read bit line RBLb of the second column 605$b$ via the second switch 672. Also, asserting the first control signal muxa high enables the first comparator 640 for read operations, and asserting the second control signal muxb high enables the second comparator 650 for read operations.

In the redundant mode, the select circuit 675 selects one of the rows in the first set of rows for a redundant read operation. In one example, the first row is in the first set of rows and the select circuit 675 selects the first row for a redundant read operation (e.g., by applying a high voltage on the first read word line RWL1).

The read circuit 602 then simultaneously reads the redundant bit from the bit cell 210-1$a$ and the bit cell 210-1$b$ in the first row as follows.

The first sense amplifier 610 sends a first sense current into the read bit line RBLa of the first column 605$a$ via the input 612. The first sense current flows through the fuse 215-1$a$ of the bit cell 210-1$a$ in the first row and first column 605$a$. The sense current flowing through the fuse 215-1$a$ produces a first read voltage on the read bit line RBLa that is approximately proportional to the resistance of the fuse 215-1$a$. The higher the resistance of the fuse 215-1$a$, the higher the first read voltage on the read bit line RBLa. The first sense amplifier 610 senses the first read voltage at the input 612 and amplifies the sensed first read voltage to generate a first output voltage (labeled "d_a") at the output 614. The first output voltage d_a is above the reference voltage ref_out when the resistance of the fuse 215-1$a$ is above the reference resistance and is below the reference voltage ref_out when the resistance of the fuse 215-1$a$ is below the reference resistance.

The first comparator 640 compares the first output voltage d_a with the reference voltage ref_out. If the first output voltage d_a is above the reference voltage ref_out, then the first comparator 640 outputs a one at output 646. In this case, a bit value of one is read from the bit cell 210-1$a$. If the first output voltage d_a is below the reference voltage ref_out, then the first comparator 640 outputs a zero at output 646. In this case, a bit value of zero is read from the bit cell 210-1$a$.

The second sense amplifier 620 sends a second sense current into the read bit line RBLb of the second column 605$b$ via the input 622. The second sense current flows through the fuse 215-1$b$ of the bit cell 210-1$b$ in the first row and second column 605$b$. The sense current flowing through the fuse 215-1$b$ produces a second read voltage on the read bit line RBLb that is approximately proportional to the resistance of the fuse 215-1$b$. The higher the resistance of the fuse 215-1$b$, the higher the second read voltage on the read bit line RBLb. The second sense amplifier 620 senses the second read voltage at the input 622 and amplifies the sensed second read voltage to generate a second output voltage (labeled "d_b") at the output 624. The second output voltage d_b is above the reference voltage ref_out when the resistance of the fuse 215-1*b* is above the reference resistance and is below the reference voltage ref_out when the resistance of the fuse 215-1*b* is below the reference resistance.

The second comparator 650 compares the second output voltage d_b with the reference voltage ref_out. If the second output voltage d_b is above the reference voltage ref_out, then the second comparator 650 outputs a one at output 656. In this case, a bit value of one is read from the bit cell 210-1*b*. If the second output voltage d_b is below the reference voltage ref_out, then the second comparator 650 outputs a zero at output 656. In this case, a bit value of zero is read from the bit cell 210-1*b*.

The logic gate 660 receives the read bit by the first comparator 640 and the read bit by the second comparator 650. In the example in FIG. 6A, the logic gate 660 is implemented with an OR gate and outputs a one at the output 666 if at least one of the read bits is one regardless of whether the other one of the read bits is a one or zero. Thus, if the redundant bit written to bit cells 210-1*a* and 210-1*b* is one and the redundant bit is erroneously read from one of the bit cells 210-1*a* and 210-1*b* due to the reverse EM effect, then the logic gate 660 still outputs the correct bit value of one.

The read circuit 602 may repeat the exemplary redundant read operation for each of the other rows storing a redundant bit (i.e., each of the other rows in the first set of rows).

In the non-redundant mode, the read circuit 602 reads one non-redundant bit from one of the first column 605*a* and the second column 605*b* at a time. To operate the read circuit 602 in the non-redundant mode, the control logic 680 asserts one of the controls signal muxa and muxb high (i.e., one) at a time depending on which one of the columns 605*a* and 605*b* the currently selected bit cell is located. In this regard, the control logic 680 receives a least significant address bit (labeled "addr[0]") of the bit cell currently selected for reading. In this example, the address of each bit cell in the first column 605*a* has a least significant address bit of zero, and the address of each bit cell in the second column 605*b* has a least significant address bit of one. Thus, in this example, the control logic 680 is able to identify the column in which the currently selected bit cell is located based on the least significant address bit. If the least significant address bit is zero, then the control logic 680 asserts the first control signal muxa high and asserts the second control signal muxb low, and, if the least significant address bit is one, then the control logic 680 asserts the first control signal muxa low and asserts the second control signal muxb high.

Exemplary operations of the read circuit 602 in the non-redundant mode will now be described for the case where the currently selected bit cell is located in the first column 605*a* (i.e., addr[0] is zero) according to certain aspects. In this case, the first control signal muxa is high and the second control signal muxb is low. Asserting the first control signal muxa high causes the first switch 670 (which is implemented with an NFET in FIG. 6A) to turn on. Asserting the second control signal muxb low causes the second switch 672 (which is implemented with an NFET in FIG. 6A) to turn off. Thus, in this example, the input of 612 of the first sense amplifier 610 is coupled to the read bit line RBLa of the first column 605*a* via the first switch 670, and the input of 622 of the second sense amplifier 620 is decoupled from the read bit line RBLb of the second column 605*b*. Also, asserting the first control signal muxa high enables the first comparator 640 for read operations, and asserting the second control signal muxb low disables the second comparator 650 for read operations. In this case, the second comparator 650 may output a constant value of zero when disabled for read operations.

The select circuit 675 selects one of the rows in the second set of rows for a non-redundant read operation. In one example, the second row is in the second set of rows, and the currently selected bit cell is bit cell 210-2*a*. In this example, the select circuit 675 selects the second row for the non-redundant read operation (e.g., by applying a high voltage on the second read word line RWL2).

The read circuit 602 then reads the non-redundant bit from bit cell 210-2*a* as follows. The first sense amplifier 610 sends a first sense current into the read bit line RBLa of the first column 605*a* via the input 612. The first sense current flows through the fuse 215-2*a* of the bit cell 210-2*a* in the first column 605*a*. The sense current flowing through the fuse 215-2*a* produces a read voltage on the read bit line RBLa that is approximately proportional to the resistance of the fuse 215-2*a*. The first sense amplifier 610 senses the read voltage at the input 612 and amplifies the sensed first read voltage to generate an output voltage (labeled "d_a") at the output 614.

The first comparator 640 compares the output voltage d_a with the reference voltage ref_out. If the output voltage d_a is above the reference voltage ref_out, then the first comparator 640 outputs a one at output 646. In this case, a bit value of one is read from the bit cell 210-2*a*. If the output voltage d_a is below the reference voltage ref_out, then the first comparator 640 outputs a zero at output 646. In this case, a bit value of zero is read from the bit cell 210-2*a*.

The logic gate 660 receives the read bit from the first comparator 640 and passes the read bit to the output 666. This is because the second comparator 650 (which is disabled for read operations) outputs a constant value of zero to the logic gate 660. As a result, the logic gate 660 (which is implemented with an OR gate in the example in FIG. 6A) passes the logic value received at the first input 662 from the first comparator 640 to the output 666.

The read circuit 602 may repeat the exemplary non-redundant read operation discussed above for each of the other bit cells in the first column 605*a* storing a non-redundant bit.

Exemplary operations of the read circuit 602 in the non-redundant mode will now be described for the case where the currently selected bit cell is located in the second column 605*b* (i.e., addr[0] is one) according to certain aspects. In this case, the first control signal muxa is low and the second control signal muxb is high. Asserting the second control signal muxb high causes the second switch 672 (which is implemented with an NFET in FIG. 6A) to turn on. Asserting the first control signal muxa low causes the first switch 670 (which is implemented with an NFET in FIG. 6A) to turn off. Thus, in this example, the input of 622 of the second sense amplifier 620 is coupled to the read bit line RBLb of the second column 605*b* via the second switch 672, and the input of 612 of the first sense amplifier 610 is decoupled from the read bit line RBLa of the first column 605*a*. Also, asserting the second control signal muxb high enables the second comparator 650 for read operations, and asserting the first control signal muxa low disables the first comparator 640 for read operations. In this case, the first comparator 640 may output a constant value of zero when disabled for read operations.

The select circuit 675 selects one of the rows in the second set of rows for a non-redundant read operation. In one example, the second row is in the second set of rows, and the currently selected bit cell is bit cell 210-2b. In this example, the select circuit 675 selects the second row for the non-redundant read operation (e.g., by applying a high voltage on the second read word line RWL2).

The read circuit 602 then reads the non-redundant bit from bit cell 210-1b as follows. The second sense amplifier 620 sends a second sense current into the read bit line RBLb of the second column 605b via the input 622. The second sense current flows through the fuse 215-2b of the bit cell 210-2b in the second column 605b. The sense current flowing through the fuse 215-2b produces a read voltage on the read bit line RBLb that is approximately proportional to the resistance of the fuse 215-2b. The second sense amplifier 620 senses the read voltage at the input 622 and amplifies the sensed read voltage to generate an output voltage (labeled "d_b") at the output 624.

The second comparator 650 compares the output voltage d_b with the reference voltage Ref_out. If the output voltage d_b is above the reference voltage Ref_out, then the second comparator 650 outputs a one at output 656. In this case, a bit value of one is read from the bit cell 210-2b. If the output voltage d_b is below the reference voltage Ref_out, then the second comparator 650 outputs a zero at output 656. In this case, a bit value of zero is read from the bit cell 210-2b.

The logic gate 660 receives the read bit from the second comparator 650 and passes the read bit to the output 666. This is because the first comparator 640 (which is disabled for read operations) outputs a constant value of zero to the logic gate 660. As a result, the logic gate 660 (which is implemented with an OR gate in the example in FIG. 6A) passes the logic value received at the second input 664 from the second comparator 650 to the output 666.

The read circuit 602 may repeat the exemplary non-redundant read operation discussed above for each of the other bit cells in the second column 605b storing a non-redundant bit.

Thus, the memory device 600 provides built-in flexible data redundancy for improved read accuracy without the need for two separate memory devices 510A and 510B as is the case for the data redundancy approach illustrated in FIG. 5. The memory device 600 lowers area overhead and power consumption compared with the approach in FIG. 5. For example, the memory device 600 is able to read a redundant bit from two bit cells (e.g., in adjacent columns) using a shared select circuit 675 (which selects the row with the two bit cells), a shared reference circuit 630 and/or another shared component (e.g., output buffer), which improves area and power efficiency. In contrast, in the approach in FIG. 2, a redundant bit is read from two bit cells in two separate memory devices 510A and 510B where each memory device includes its own select circuit, its own reference circuit, etc.

FIG. 7 shows an exemplary implementation of the sense circuit 608 according to certain aspects of the present disclosure. In this example, the memory device 600 includes enable switch 785 coupled between a voltage supply rail and the sense circuit 608. The enable switch 785 is controlled by the sense circuit enable signal (labeled "sa_en"). In the example in FIG. 7, the enable switch 785 is implemented with a p-type field effect transistor (PFET), in which the sense circuit enable signal is applied to the gate of the PFET. In this example, the enable switch 785 turns on when the sense circuit enable signal is low and turns off when the sense circuit enable signal is high.

In this example, the first sense amplifier 610 includes a first transistor 710, a second transistor 712, and a third transistor 714. The first transistor 710 is implemented with a PFET, in which the source of the first transistor 710 is coupled to the enable switch 785. The gate of the first transistor 710 is coupled to a bias output 736 of the reference circuit 630, which biases the gate of the first transistor 710 to set the sense current of the first sense amplifier 610, as discussed further below. The second transistor 712 is implemented with an NFET configured as a common-gate amplifier, in which the drain of the second transistor 712 is coupled to the drain of the first transistor 710, the gate of the second transistor 712 is coupled to a bias voltage (labeled "Vbias"), and the source of the second transistor 712 is coupled to the input 612 of the first sense amplifier 610. The output 614 of the first sense amplifier 610 is coupled to the drain of the second transistor 712. The third transistor 714 is coupled between the input 612 of the first sense amplifier 610 and ground. The third transistor 714 is used as a discharge transistor controlled by a discharge control signal (labeled "disch") input to the gate of the third transistor 714, as discussed further below.

The second sense amplifier 620 includes a fourth transistor 720, a fifth transistor 722, and a sixth transistor 724. The fourth transistor 720 is implemented with a PFET, in which the source of the fourth transistor 720 is coupled to the enable switch 785. The gate of the fourth transistor 720 is coupled to the bias output 736 of the reference circuit 630, which biases the gate of the fourth transistor 720 to set the sense current of the second sense amplifier 620, as discussed further below. The fifth transistor 722 is implemented with an NFET configured as a common-gate amplifier, in which the drain of the fifth transistor 722 is coupled to the drain of the fourth transistor 720, the gate of the fifth transistor 722 is coupled to the bias voltage (labeled "Vbias"), and the source of the fifth transistor 722 is coupled to the input 622 of the second sense amplifier 620. The output 624 of the second sense amplifier 620 is coupled to the drain of the fifth transistor 722. The sixth transistor 724 is coupled between the input 622 of the second sense amplifier 620 and ground. The sixth transistor 724 is used as a discharge transistor controlled by the discharge control signal (labeled "disch") input to the gate of the sixth transistor 724, as discussed further below.

The reference circuit 630 includes a seventh transistor 730, an eighth transistor 732, a ninth transistor 734, and a reference resistor (labeled "Rref"). The seventh transistor 730 is implemented with a PFET, in which the source of the seventh transistor 730 is coupled to the enable switch 785, and the gate of the seventh transistor 730 is coupled to the bias output 736 of the reference circuit 630, which is coupled to the gate of the first transistor 710 in the first sense amplifier 610 and the gate of the fourth transistor 720 in the second sense amplifier 620. The drain of the seventh transistor 730 is coupled to the gate of the seventh transistor 730. This causes the seventh transistor 730, the first transistor 710 and the fourth transistor 720 to form a current mirror in which the first transistor 710 and the fourth transistor 720 mirror the current flowing through the seventh transistor 730. As a result, the seventh transistor 730 biases the gates of the first transistor 710 and the fourth transistor 720 via the bias output 736 to mirror the current flowing through the seventh transistor 730.

The eighth transistor 732 is implemented with an NFET configured as a common-gate amplifier, in which the drain of the eighth transistor 732 is coupled to the drain of the seventh transistor 730, and the gate of the eighth transistor 732 is coupled to the bias voltage (labeled "Vbias"). The output 632 of the reference circuit 630 is coupled to the drain of the eighth transistor 732. The reference resistor Rref is coupled between the source of the eighth transistor 732 and ground. The ninth transistor 734 is coupled between the reference resistor Rref and ground. The ninth transistor 734 is used as a discharge transistor controlled by the discharge control signal (labeled "disch") input to the gate of the ninth transistor 734, as discussed further below.

The bias voltage Vbias discussed above may be provided by a bias circuit 770 coupled to the gates of the second transistor 712, the fifth transistor 722 and the eighth transistor 732. The bias circuit 770 may be implemented with a voltage divider or another type of bias voltage generator.

Exemplary operations of the sense circuit 608 will now be described according to certain aspects of the present disclosure.

When a read operation is not being performed, the memory control circuit 690 may disable the sense circuit 608 by turning off the enable switch 785 using the sense circuit enable signal (labeled "sa_en"). The memory control circuit 690 also turns on the third transistor 714, the sixth transistor 724 and the ninth transistor 734 using the discharge control signal. This causes the third transistor 714 to pull the input 612 of the first sense amplifier 610 to ground, the sixth transistor 724 to pull the input 622 of the second sense amplifier 620 to ground, and the ninth transistor 734 to pull the voltage at the reference resistor Rref to ground.

To enable the sense circuit 608 for read operations, the memory control circuit 690 turns on the enable switch 785 using the sense circuit enable signal, and turns off the third transistor 714, the sixth transistor 724 and the ninth transistor 734 using the discharge control signal.

The turning on of the enable switch 785 allows a reference current (labeled "Iref") to flow through the reference resistor Rref through the enable switch 785, the seventh transistor 730 and the eighth transistor 732. The reference current flowing through the reference resistor Rref produces an internal reference voltage (labeled "Vref") across the reference resistor Rref, in which the internal reference voltage is approximately proportional to the reference resistance. The eighth transistor 732 (which is configured as a common gate amplifier) amplifies the internal reference voltage Vref to generate the reference voltage ref_out at the drain of the eighth transistor 732, which is coupled to the output 632 of the reference circuit 630.

When the first switch 670 is turned on, the first transistor 710 in the first sense amplifier 610 mirrors the reference current to generate a sense current (labeled "Isensea") that is approximately equal to the reference current. The sense current flows through the second transistor 712 to the read bit line RBLa coupled to the input 612. The sense current flows through the fuse of a selected one of the bit cells in the first column 605a, producing a read voltage on the read bit line RBLa that is approximately proportional to the resistance of the fuse. The second transistor 712 amplifies the read voltage at the input 612 of the first sense amplifier 610 to generate the output voltage (labeled "d_a") at the output 614 of the first sense amplifier 610.

In this example, the output voltage d_a is above the reference voltage ref_out when the fuse resistance of the selected bit cell in the first column 605a is above the resistance of the reference resistor Rref (i.e., the reference resistance). The output voltage d_a is below the reference voltage ref_out when the fuse resistance of the selected bit cell in the first column 605a is below the resistance of the reference resistor Rref (i.e., the reference resistance).

Also, in this example, the second transistor 712 limits the read voltage at the input 612. This is because the maximum voltage at the source of the second transistor 712 (which is coupled to the input 612) is lower than the bias voltage (labeled "Vbias") minus the threshold voltage of the second transistor 712. By limiting the read voltage at the input 612 of the first sense amplifier 610, the second transistor 712 prevents the voltage on the read bit line RBLa from becoming too high during a read operation, which can potentially cause a fuse that is unblown to accidental blow.

When the second switch 672 is turned on, the fourth transistor 720 in the second sense amplifier 620 mirrors the reference current to generate a sense current (labeled "Isenseb") that is approximately equal to the reference current. The sense current flows through the fifth transistor 722 to the read bit line RBLb coupled to the input 622. The sense current flows through the fuse of a selected one of the bit cells in the second column 605b, producing a read voltage on the read bit line RBLb that is approximately proportional to the resistance of the fuse. The fifth transistor 722 amplifies the read voltage at the input 622 of the second sense amplifier 620 to generate the output voltage (labeled "d_b") at the output 624 of the second sense amplifier 620.

In this example, the output voltage d_b is above the reference voltage ref_out when the fuse resistance of the selected bit cell in the second column 605b is above the resistance of the reference resistor Rref (i.e., the reference resistance). The output voltage d_b is below the reference voltage ref_out when the fuse resistance of the selected bit cell in the second column 605b is below the resistance of the reference resistor Rref (i.e., the reference resistance).

Also, in this example, the fifth transistor 722 limits the read voltage at the input 622. This is because the maximum voltage at the source of the fifth transistor 722 (which is coupled to the input 622) is lower than the bias voltage (labeled "Vbias") minus the threshold voltage of the fifth transistor 722. By limiting the read voltage at the input 622 of the second sense amplifier 620, the fifth transistor 722 prevents the voltage on the read bit line RBLb from becoming too high during a read operation, which can potentially cause a fuse that is unblown to accidental blow.

In the example in FIG. 7, the first comparator 640 is implemented with a first voltage-latched sense amplifier (VLSA) with the plus input of the VLSA coupled to the first input 642 and the minus input of the VLSA coupled to the second input 644. The second comparator 650 is implemented with a second VLSA with the plus input of the VLSA coupled to the first input 652 and the minus input of the VLSA coupled to the second input 654.

Figures 8A, 8B:
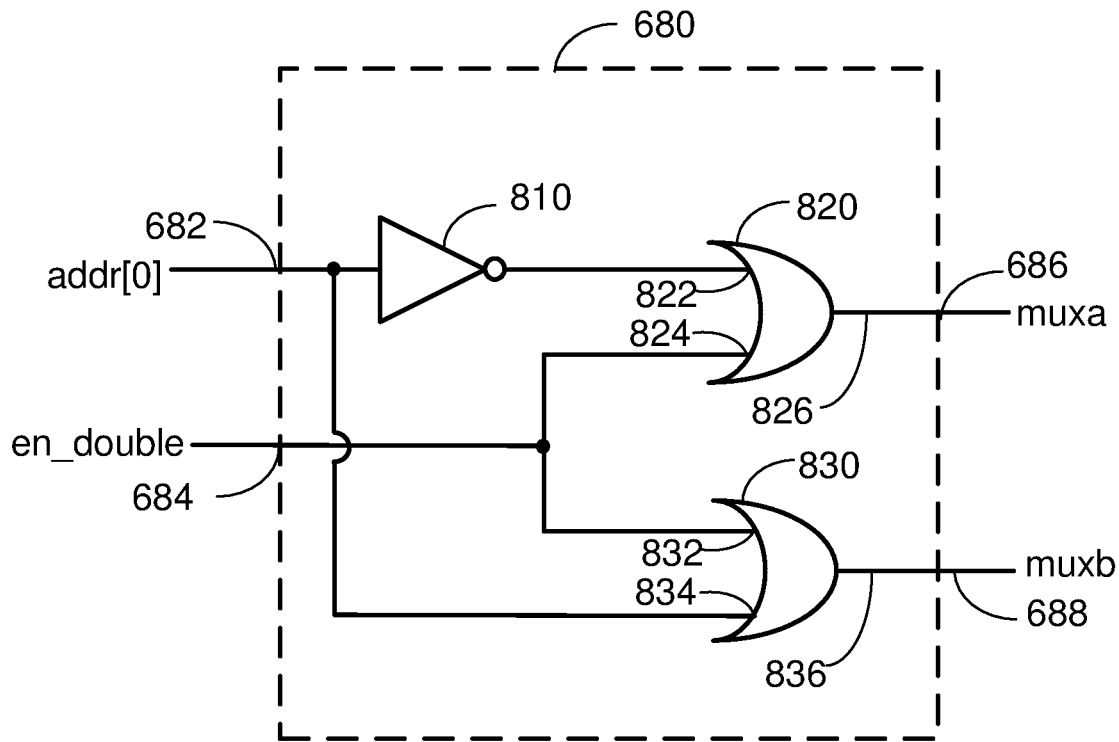
FIG. 8A shows an exemplary implementation of a control logic according to certain aspects of the present disclosure.
FIG. 8B shows an exemplary truth table for the exemplary control logic in FIG. 8A according to certain aspects of the present disclosure.

FIG. 8A shows an exemplary implementation of the control logic 680 according to certain aspects. In this example, the control logic 680 includes a first OR gate 820, a second OR gate 830, and an inverter 810. The first OR gate 820 includes a first input 822 coupled to the input 682 via the inverter 810, a second input 824 coupled to the input 684, and an output 826 coupled to the output 686. The second OR gate 830 includes a first input 832 coupled to the input 684, a second input 834 coupled to the input 682, and an output 836 coupled to the output 688.

FIG. 8B shows an exemplary truth table for the control logic 680 according to certain aspects. As discussed above, the redundant mode is enabled when the redundancy enable signal (labeled "en_double") is one and the non-redundant mode is enabled when the redundancy enable signal is zero. When the redundant mode is enabled both control signals muxa and muxb are one regardless of the value of the least significant address bit (labeled "addr[0]"). When the non-redundant mode is enabled, one of the control signals muxa and muxb is one and the other one of the control signals muxa and muxb is zero depending on the value of the least significant address bit.

As discussed above, the first column 605a and the second column 605b are not limited to the exemplary column 205 in FIG. 2. For example, the first column 605a and the second column 605b may each be implemented with the exemplary column 105 shown in FIG. 1. In this example, the first switch 670 is coupled between the input 612 of the first sense amplifier 610 and the bit line BL of the first column 605a, and the second switch 672 is coupled between the input 622 of the second sense amplifier 620 and the bit line BL of the second column 605b. Note that, in this example, the bit line BL is not split into the write bit line WBL and the read bit line RBL.

Although FIG. 6A shows an example of one pair of columns 605a and 605b in the memory device 600 for ease of discussion, it is to be appreciated that the memory device 600 may include multiple pairs of columns. The memory device 600 may also include multiple read circuits where each of the read circuits is configured to read bit cells in a respective pair of columns. Each of the read circuits may be implemented with the respective read circuit 602 shown in FIG. 6A (e.g., each of the read circuits is a separate instance of the read circuit 602 shown in FIG. 6A). In this example, each of the read circuits may be configured to read bit cells in the respective pair of columns in the redundant mode or the non-redundant mode under the control of the control logic 680 and the memory control circuit 690. The read circuits may output read bits in parallel, allowing the memory device 600 to output multiple read bits in parallel in one read cycle.

Aspects of the present disclosure are described above using the example in which a blown fuse represents a bit value of one and an unblown fuse represents a bit value of zero. However, it is to be appreciated that the present disclosure can also be applied to the example where a blown fuse represents a bit value of zero and an unblown fuse represents a bit value of one. In this example, each comparator 650 and 640 may output a zero if the output voltage of the respective sense amplifier is above the reference voltage and output a one if the output voltage of the respective sense amplifier is below the reference voltage. Also, the logic gate 660 may be configured to output a zero if at least one of the outputs of the comparators 640 and 650 is a zero. In this example, the logic gate 660 may be implemented with an AND gate. It is to be appreciated that the logic gate 660 may be implemented with multiple smaller logic gates (e.g., logic gate cells) that are interconnected to form the logic gate 660.

It is also to be appreciated that the first comparator 640 and the second comparator 650 are not limited to voltage-latched sense amplifiers (VLSAs). Generally, each comparator may be implemented with a circuit (e.g., amplifier) configured to generate a one or a zero based on whether the output voltage of the respective sense amplifier is above or below the reference voltage. In certain aspects, the output of each comparator may be rail-to-rail in which the voltage of a one is approximately equal to a supply voltage and the voltage of a zero is approximately equal to ground.

Figure 9A:
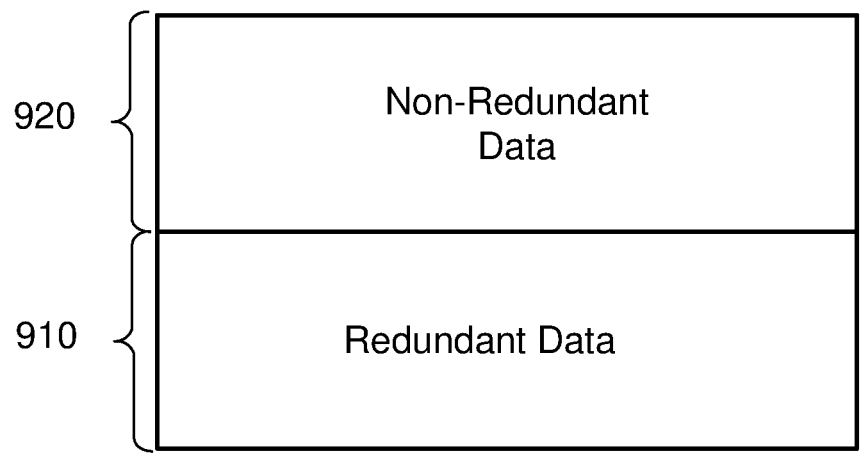
FIG. 9A shows an example of redundant data and non-redundant data stored in a memory array according to certain aspects of the present disclosure.
Figure 9B:
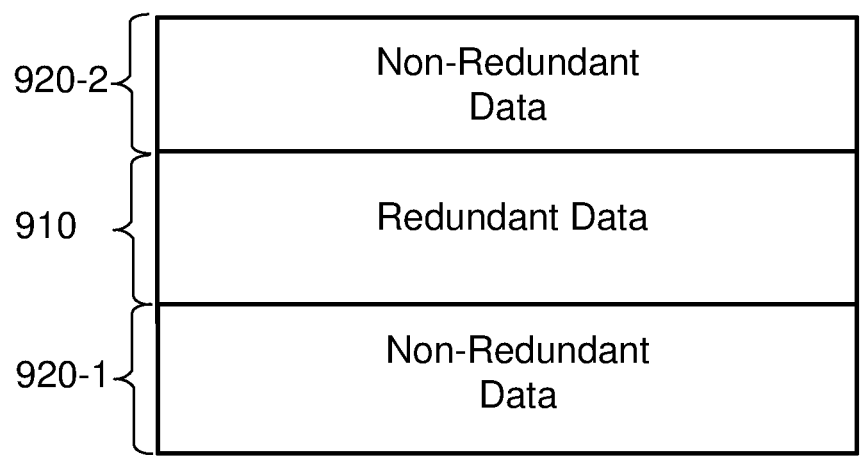
FIG. 9B shows another example of redundant data and non-redundant data stored in a memory array according to certain aspects of the present disclosure.

As discussed above, aspects of the present disclosure provide flexibility in the amount of memory space allocated for redundant data and the amount of memory space allocated for non-redundant data. In this regard, FIGS. 9A and 9B show two examples of different allocations for redundant data and non-redundant data in the memory array of the memory device 600 according to certain aspects. In the example in FIG. 9A, rows in the first set of rows 910 store redundant data and rows in the second set of rows 920 store non-redundant data. As discussed above, the number of rows in the first set of rows 910 and the number of rows in the second set of rows 920 are variable, allowing the memory device 600 to accommodate redundant data of different sizes and non-redundant data of different sizes. In this example, the memory control circuit 690 enables the redundant mode (e.g., asserts en_double high) when the read circuits in the memory device 600 read bit cells in the first set of rows 910, and enables the non-redundant mode (e.g., asserts en_double low) when the read circuits in the memory device 600 read bit cells in the second set of rows.

It is to be appreciated that rows in the first set of rows 910 and/or the rows in the second set of rows 920 do not need to be consecutive rows. In this regard, FIG. 9B shows an example in which the second set of rows 920 is divided into a first subset of the second set of rows 920-1 and a second subset of the second set of rows 920-2, in which the first set of rows 910 storing the redundant data is between the first subset of the second set of rows 920-1 and the second subset of the second set of rows 920-2.

Figure 10:
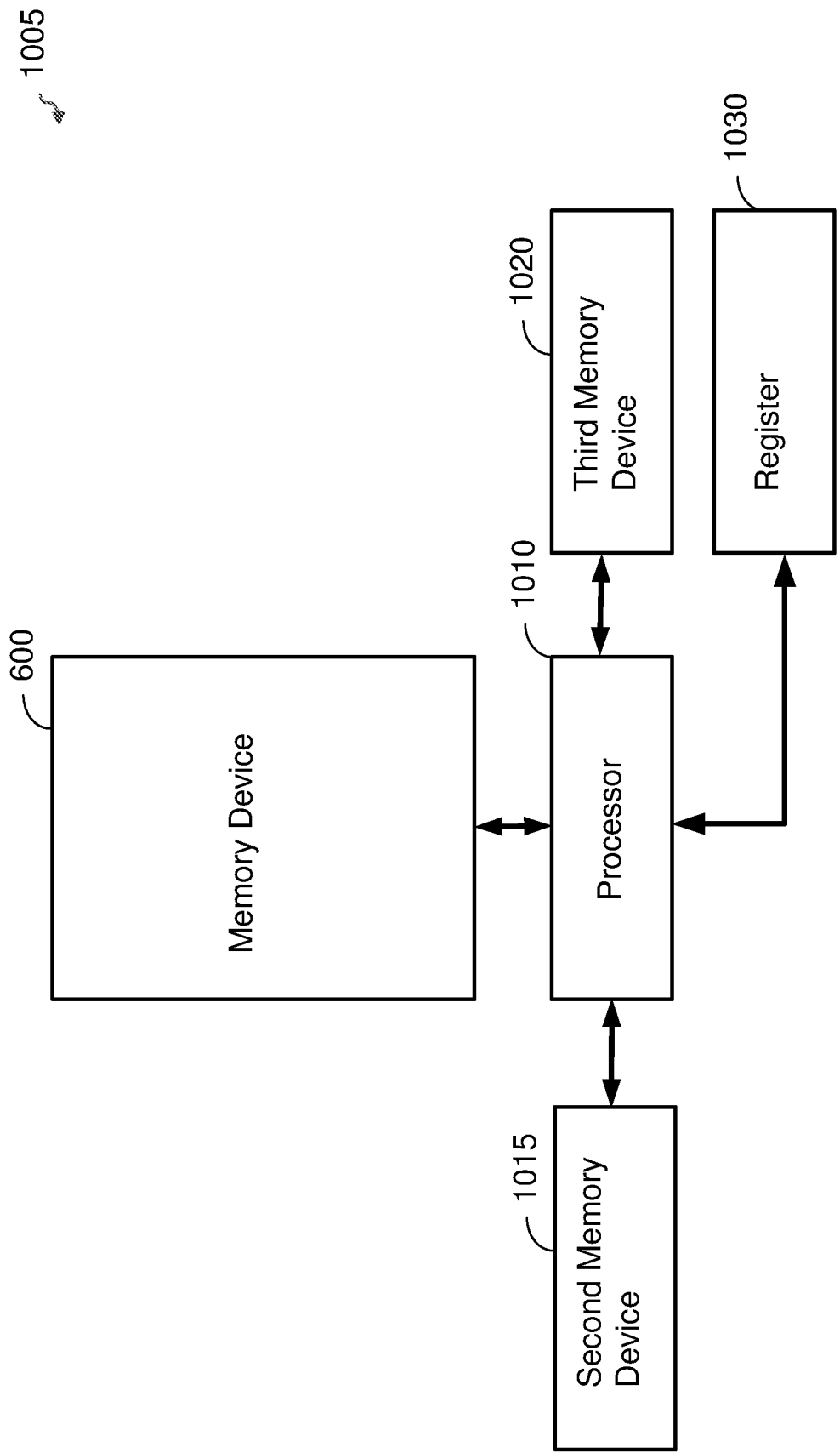
FIG. 10 shows an example of a system in which aspects of the present disclosure may be used according to certain aspects of the present disclosure.

FIG. 10 shows an example of a system 1005 in which aspects of the present disclosure may be used according to certain aspects of the present disclosure. The system 1005 may be incorporated in a mobile device (e.g., handset). In this example, the system 1005 includes the memory device 600, a processor 1010, a second memory device 1015, a third memory device 1020, and a register 1030. The second memory device 1015 may include read-only memory (ROM), flash memory, a hard drive, a solid state drive, or any combination thereof. The third memory device 1020 may include random access memory, flash memory, or another type of rewritable memory device.

The processor 1010 is coupled to the memory device 600, the second memory device 1015, the third memory device 1020, and the register 1030. With regard to the memory device 600, the processor 1010 may be coupled to one or more read circuits (e.g., one or more instances of the read circuit 602) in the memory device 600 to read bits (e.g., security key, system settings, etc.) stored in the memory device 600. For example, the processor 1010 may be coupled to the output 666 of the logic gate 660 (e.g., via an output buffer).

In one example, the second memory device 1015 may store one or more bootloaders and/or other programs (also referred to as images). In this example, the processor 1010 may read a digital signature of a bootloader or other program from the second memory device 1015, read a security key stored in the memory device 600, and verify the digital signature of the bootloader or other program using the security key in an authentication process. If the digital signature is verified, then the processor 1010 may load the bootloader or other program to the third memory device 1020 and/or another memory device (not shown). The bootloader may be configured to perform boot operations for the system 1005 during boot up. In this example, the security key may be redundantly stored in the memory device 600 to improve the integrity of the security key and read from the memory device 600 in the redundant mode.

In another example, the processor 1010 may read system settings from the memory device 600, and load the system settings in the register 1030. The register 1030 may be coupled to one or more devices (not shown) in the system 1005, in which the one or more devices are configured according to the system settings stored in the register 1030. In this example, the system settings may be redundantly stored in the memory device 600 to improve the integrity of system settings and read from the memory device 600 in the redundant mode.

Figure 11:
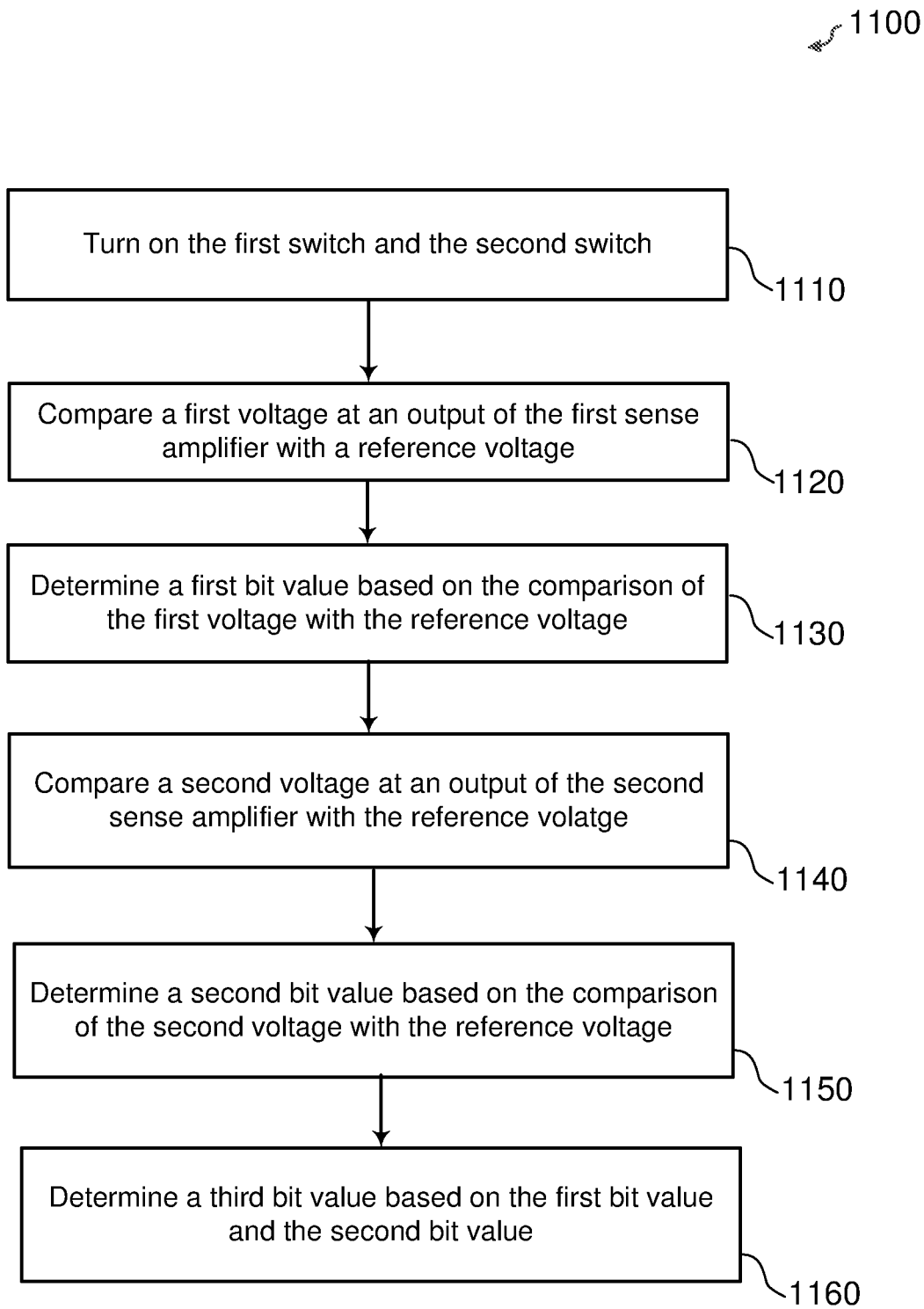
FIG. 11 is a flowchart illustrating a method of a redundant read operation in a memory device according to certain aspects of the present disclosure.

FIG. 11 illustrates a method 1100 of a redundant read operation in a memory device according to certain aspects of the present disclosure. The memory device (e.g., memory device 600) includes a first sense amplifier (e.g., first sense amplifier 610), a first switch (e.g., switch 670) coupled between an input of the first sense amplifier and a first bit line (e.g., RBLa), a second sense amplifier (e.g., second sense amplifier 620), and a second switch (e.g., switch 672) coupled between an input of the second sense amplifier and a second bit line (e.g., RBLb).

At block 1110, the first switch and the second switch are turned on. For example, the first switch and the second switch may be turned on by the control logic 680.

At block 1120, a first voltage at an output of the first sense amplifier is compared with a reference voltage. For example, the first output voltage may be compared with the reference voltage by the first comparator 640.

At block 1130, a first bit value is determined based on the comparison of the first voltage with the reference voltage. For example, the first bit value may be one if the first voltage is above the reference voltage and zero if the first voltage is below the reference voltage.

At block 1140, a second voltage at an output of the second sense amplifier is compared with the reference voltage. For example, the second output voltage may be compared with the reference voltage by the second comparator 650.

At block 1150, a second bit value is determined based on the comparison of the second voltage with the reference voltage. For example, the second bit value may be one if the second voltage is above the reference voltage and zero if the second voltage is below the reference voltage.

At block 1160, a third bit value is determined based on the first bit value and the second bit value. For example, the logic gate 660 may determine the third bit value. In one example, determining the third bit value includes performing an OR operation on the first bit value and the second bit value. In this example, the third bit value is one if at least one of the first bit value and the second bit value is one.

The first bit line (e.g., RBLa) may correspond to a first column (e.g., column 605a) in a memory array, the second bit line (e.g., RBLb) may correspond to a second column (e.g., column 605b) in the memory array, and the first column may be adjacent to the second column.

The method 1100 may optionally include performing a first non-redundant read operation, wherein performing the first the non-redundant read operation includes turning on the first switch, turning off the second switch, comparing a third voltage at the output of the first sense amplifier with the reference voltage, and determining a fourth bit value based on the comparison of the third voltage with the reference voltage.

The method 1100 may optionally include performing a second non-redundant read operation, wherein performing the second non-redundant read operation includes turning off the first switch, turning on the second switch, comparing a fourth voltage at the output of the second sense amplifier with the reference voltage, and determining a fifth bit value based on the comparison of the fourth voltage with the reference voltage.

The method 1100 may optionally include generating the reference voltage, wherein generating the reference voltage includes passing a current (e.g., Iref) through a reference resistor (e.g., reference resistor Rref), and amplifying a voltage (e.g., Vref) across the reference resistor to generate the reference voltage. The voltage may be amplified by a common gate amplifier (e.g., the eighth transistor 732 in a common-gate configuration).

It is to be appreciated that the present disclosure is not limited to the exemplary terminology used above to describe aspects of the present disclosure. For example, an electronical fuse may also be referred to as an electronic fuse, an electrically programmable fuse, a fusible link, or another term. In another example, a bit cell may also be referred to as a memory cell, or another term. In another example, a select circuit may also be referred to as a row decoder, or another term.

Any reference to an element herein using a designation such as "first," "second," and so forth does not generally limit the quantity or order of those elements. Rather, these designations are used herein as a convenient way of distinguishing between two or more elements or instances of an element. Thus, a reference to first and second elements does not mean that only two elements can be employed, or that the first element must precede the second element.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "approximately", as used herein with respect to a stated value or a property, is intended to indicate being within 10% of the stated value or property.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A memory device, comprising:
   a first sense amplifier having an input and an output;
   a first switch coupled between the input of the first sense amplifier and a first bit line;
   a second sense amplifier having an input and an output;
   a second switch coupled between the input of the second sense amplifier and a second bit line;
   a reference circuit having an output;
   a first comparator having a first input, a second input, and an output, wherein the first input of the first comparator is coupled to the output of the first sense amplifier, and the second input of the first comparator is coupled to the output of the reference circuit;
   a second comparator having a first input, a second input, and an output, wherein the first input of the second comparator is coupled to the output of the second sense amplifier, and the second input of the second comparator is coupled to the output of the reference circuit; and
   a logic gate having a first input, a second input, and an output, wherein the first input of the logic gate is coupled to the output of the first comparator, and the second input of the logic gate is coupled to the output of the second comparator.

2. The memory device of claim 1, wherein the logic gate comprises an OR gate.

3. The memory device of claim 1, wherein the first comparator comprises a first voltage-latched sense amplifier, and the second comparator comprises a second voltage-latched sense amplifier.

4. The memory device of claim 1, wherein the first switch comprises a first n-type field effect transistor, and the second switch comprises a second n-type field effect transistor.

5. The memory device of claim 1, further comprising a control logic configured to:
receive a redundancy enable signal:
turn on the first switch and the second switch if the redundancy enable signal has a first value; and
turn on a first one of the first switch and the second switch and turn off a second one of the first switch and the second switch if the redundancy enable signal has a second value.

6. The memory device of claim 5, wherein the first value is one and the second value is zero.

7. The memory device of claim 1, wherein the reference circuit comprises:
a first transistor, wherein a source of the first transistor is coupled to a supply rail, and a drain of the first transistor is coupled to a gate of the first transistor;
a second transistor, wherein a drain of the second transistor is coupled to the drain of the first transistor and the output of the reference circuit, and a gate of the second transistor is biased by a bias voltage; and
a reference resistor coupled between a source of the second transistor and a ground.

8. The memory device of claim 7, wherein the first sense amplifier comprises:
a third transistor, wherein a source of the third transistor is coupled to the supply rail, and a gate of the third transistor is coupled to the gate of the first transistor; and
a fourth transistor, wherein a drain of the fourth transistor is coupled to the drain of the third transistor and the output of the first sense amplifier, a gate of the fourth transistor is biased by the bias voltage, and a source of the fourth transistor is coupled to the input of the first sense amplifier.

9. The memory device of claim 1, further comprising:
a first plurality of bit cells coupled to the first bit line, each of the first plurality of bit cells comprising a respective fuse; and
a second plurality of bit cells coupled to the second bit line, each of the second plurality of bit cells comprising a respective fuse.

10. A system, comprising:
a first memory device, wherein the first memory device comprises:
a first sense amplifier having an input and an output;
a first switch coupled between the input of the first sense amplifier and a first bit line;
a second sense amplifier having an input and an output;
a second switch coupled between the input of the second sense amplifier and a second bit line;
a reference circuit having an output;
a first comparator having a first input, a second input, and an output, wherein the first input of the first comparator is coupled to the output of the first sense amplifier, and the second input of the first comparator is coupled to the output of the reference circuit;
a second comparator having a first input, a second input, and an output, wherein the first input of the second comparator is coupled to the output of the second sense amplifier, and the second input of the second comparator is coupled to the output of the reference circuit; and
a logic gate having a first input, a second input, and an output, wherein the first input of the logic gate is coupled to the output of the first comparator, and the second input of the logic gate is coupled to the output of the second comparator; and
a processor coupled to the first memory device.

11. The system of claim 10, further comprising a register coupled to the processor.

12. The system of claim 10, further comprising a second memory device coupled to the processor.

13. The system of claim 12, wherein the second memory device comprises a read-only memory (ROM), a flash memory, a hard drive, or a solid state drive.

14. The system of claim 10, wherein the logic gate comprises an OR gate.

15. The system of claim 10, wherein the first memory device further comprises:
a first plurality of bit cells coupled to the first bit line, each of the first plurality of bit cells comprising a respective fuse; and
a second plurality of bit cells coupled to the second bit line, each of the second plurality of bit cells comprising a respective fuse.

16. A method of a redundant read operation in a memory device, the memory device including a first sense amplifier, a first switch coupled between an input of the first sense amplifier and a first bit line, a second sense amplifier, and a second switch coupled between an input of the second sense amplifier and a second bit line, the method comprising:
turning on the first switch and the second switch;
comparing a first voltage at an output of the first sense amplifier with a reference voltage;
determining a first bit value based on the comparison of the first voltage with the reference voltage;
comparing a second voltage at an output of the second sense amplifier with the reference voltage;
determining a second bit value based on the comparison of the second voltage with the reference voltage; and
determining a third bit value based on the first bit value and the second bit value.

17. The method of claim 16, wherein the first bit line corresponds to a first column in a memory array, the second bit line corresponds to a second column in the memory array, and the first column is adjacent to the second column.

18. The method of claim 16, wherein determining the third bit value comprises performing an OR operation on the first bit value and the second bit value.

19. The method of claim 18, wherein:
the first bit value is one if the first voltage is above the reference voltage;
the first bit value is zero if the first voltage is below the reference voltage;
the second bit value is one if the second voltage is above the reference voltage; and
the second bit value is zero if the second voltage is below the reference voltage.

20. The method of claim 16, further comprising performing a first non-redundant read operation, wherein performing the first non-redundant read operation comprises:
turning on the first switch;
turning off the second switch;
comparing a third voltage at the output of the first sense amplifier with the reference voltage; and determining a fourth bit value based on the comparison of the third voltage with the reference voltage.

21. The method of claim 20, further comprising performing a second non-redundant read operation, wherein performing the second non-redundant read operation comprises:
   turning off the first switch;
   turning on the second switch;
   comparing a fourth voltage at the output of the second sense amplifier with the reference voltage; and
   determining a fifth bit value based on the comparison of the fourth voltage with the reference voltage.

22. The method of claim 21, further comprising receiving an address bit, wherein the first non-redundant read operation is performed if the address bit is zero and the second non-redundant read operation is performed if the address bit is one.

23. The method of claim 16, further comprising generating the reference voltage, wherein generating the reference voltage comprises:
   passing a current through a reference resistor; and
   amplifying a voltage across the reference resistor to generate the reference voltage.

* * * * *